(12) United States Patent
Chang et al.

(10) Patent No.: US 10,553,406 B2
(45) Date of Patent: Feb. 4, 2020

(54) PLASMA GENERATING APPARATUS AND SUBSTRATE PROCESSING APPARATUS

(75) Inventors: Hong-Young Chang, Daejeon (KR); Sang-Hun Seo, Daejeon (KR); Yun-Seong Lee, Daejeon (KR)

(73) Assignees: Jusung Engineering Co., LTD., Gwangju-Si (KR); Korea Advanced Institute of Science and Technology, Daejeon (KR)

( * ) Notice: Subject to any disclaimer, the term of this patent is extended or adjusted under 35 U.S.C. 154(b) by 1292 days.

(21) Appl. No.: 14/004,411

(22) PCT Filed: Mar. 29, 2012

(86) PCT No.: PCT/KR2012/002337
§ 371 (c)(1),
(2), (4) Date: Sep. 10, 2013

(87) PCT Pub. No.: WO2012/134199
PCT Pub. Date: Oct. 4, 2012

(65) Prior Publication Data
US 2014/0007812 A1    Jan. 9, 2014

(30) Foreign Application Priority Data

Mar. 30, 2011 (KR) .................. 10-2011-0028765
Apr. 6, 2011 (KR) .................. 10-2011-0031535
Apr. 8, 2011 (KR) .................. 10-2011-0032636

(51) Int. Cl.
H01J 37/32    (2006.01)
(52) U.S. Cl.
CPC .. H01J 37/32568 (2013.01); H01J 37/32091 (2013.01); H01J 37/32541 (2013.01); H01J 37/32577 (2013.01)

(58) Field of Classification Search
CPC .............. C23C 16/509; H01J 37/32091; H01J 37/32357; H01J 37/3244; H01J 37/32541;
(Continued)

(56) References Cited

U.S. PATENT DOCUMENTS 5,609,690 A * 3/1997 Watanabe ............. C23C 16/509
                                                118/723 E
5,981,899 A * 11/1999 Perrin ............... H01J 37/32541
                                                118/723 R
(Continued)

FOREIGN PATENT DOCUMENTS

CN    101420816 A    4/2009
JP    2001508923 A    7/2001
(Continued)

OTHER PUBLICATIONS

"Capacitively Coupled RF-Plasma Reactor"; Abstract of JP2001508923 (A); Jul. 3, 2001; http://worldwide.espacenet.com.
(Continued)

*Primary Examiner* — Benjamin Kendall
(74) *Attorney, Agent, or Firm* — Andrew D. Fortney; Central California IP Group, P.C.

(57) ABSTRACT

Provided are a plasma generating apparatus and a substrate treating apparatus. The plasma generating apparatus includes a plurality of ground electrodes arranged inside a vacuum container and extending parallel to each other and power electrodes arranged between the ground electrodes. An area where a distance between the ground electrode and the power electrode is constant exists, and the power electrodes are tapered in a direction facing the substrate. The power electrodes are connected to an RF power source, and height of the power electrode is greater than that of the ground electrode in the direction facing the substrate.

21 Claims, 18 Drawing Sheets

(58) Field of Classification Search
CPC ........... H01J 37/32568; H01J 37/32577; H01J 37/32596; H05H 2001/4675; H05H 2001/488
See application file for complete search history.

(56) References Cited

U.S. PATENT DOCUMENTS

| | | | |
|---|---|---|---|
| 6,281,469 | B1 | 8/2001 | Perrin et al. |
| 6,353,201 | B1* | 3/2002 | Yamakoshi ....... H01J 37/32082 118/723 I |
| 8,018,163 | B2 | 9/2011 | Wi |
| 2001/0019746 | A1* | 9/2001 | Higashikawa .......... C23C 16/24 427/569 |
| 2004/0137647 | A1* | 7/2004 | Miyazaki ............ C23C 16/5096 438/3 |
| 2005/0022740 | A1* | 2/2005 | Hatano ............... C23C 16/4405 118/723 E |
| 2009/0102385 | A1* | 4/2009 | Wi .................... H01J 37/32091 315/111.21 |
| 2010/0006543 | A1 | 1/2010 | Sawada |
| 2011/0042008 | A1* | 2/2011 | Hori .................... H01J 37/3244 156/345.33 |
| 2011/0114600 | A1 | 5/2011 | Hirayama |

FOREIGN PATENT DOCUMENTS

| | | |
|---|---|---|
| JP | 2008172168 | 7/2008 |
| KR | 20070107301 | 11/2007 |
| KR | 20090066996 | 6/2009 |
| KR | 20100052829 | 5/2010 |
| KR | 20100126586 | 12/2010 |
| KR | 20100129371 | 12/2010 |
| KR | 20110018996 | 2/2011 |

OTHER PUBLICATIONS

H.S. Lee, et al., Effective design of multiple hollow cathode electrode to enhance the density of rf capacitively coupled plasma, Applied Physics Letters 97, Aug. 27, 2010, pp. 081503-1-081503-3, vol. 97.

Wi Soon-Im; "Capacitively Coupled Plasma Reactor"; Bibliographic data of CN101420816 (A); Apr. 29, 2009; 13 pgs.; http://worldwide.espacenet.com.

* cited by examiner

PLASMA GENERATING APPARATUS AND SUBSTRATE PROCESSING APPARATUS

CROSS-REFERENCE TO RELATED APPLICATIONS

This application is a continuation of and claims priority to PCT/KR2012/002337 filed on Mar. 29, 2012, which claims priority to Korea Patent Application No. 10-2011-0028765 filed on Mar. 30, 2011, Korea Patent Application No. 10-2011-0031535 filed on Apr. 6, 2011, and Korea Patent Application No. 10-2011-0032636 filed on Apr. 8, 2011, the entireties of which are both hereby incorporated by reference.

BACKGROUND OF THE INVENTION

1. Field of the Invention

The present invention relates capacitively coupled plasma generating apparatuses and, more particularly, to a capacitively coupled plasma generating apparatus divided into a plurality of electrodes.

2. Description of the Related Art

High-frequency flat plate type capacitively coupled plasma apparatuses are limited in process uniformity and process speed.

SUMMARY OF THE INVENTION

Embodiments of the present invention provide a plasma generating apparatus in which a pattern of electrodes is not formed on a substrate and which has superior process uniformity and high process speed.

Embodiments of the present invention provide a substrate processing apparatus in which a pattern of electrodes is not formed on a substrate and which has superior process uniformity and high process speed.

A plasma generating apparatus according to an embodiment of the present invention may include a plurality of ground electrodes arranged inside a vacuum container and extending parallel to each other; and at least one power electrode arranged between the ground electrodes. An area where a distance between the ground electrode and the power electrode is constant exists. The power electrodes are tapered in a direction facing a substrate. The power electrodes are connected to an RF power source. Height of the power electrode is greater than that of the ground electrode in a direction facing the substrate.

In one embodiment of the present invention, one end of the power electrodes and one end of the ground electrodes may be rounded in the direction facing the substrate.

In one embodiment of the present invention, an angle between a direction extending along one surface of the power electrode and the direction facing the substrate may be 5 degrees to 10 degrees.

In one embodiment of the present invention, the number of the power electrodes may be even.

In one embodiment of the present invention, the plasma generating apparatus may further include a dielectric supporter on which the ground electrodes and the power electrodes are mounted. One end of the ground electrodes is connected to the dielectric supporter, one end of the power electrodes is connected to the dielectric supporter, and the other end of the ground electrodes and the other end of the power electrodes face the substrate.

In one embodiment of the present invention, the dielectric supporter may include a plurality of nozzles to inject a process gas between the ground electrode and the power electrode.

In one embodiment of the present invention, the plasma generating apparatus may further include a gas distribution unit disposed on the dielectric supporter to distribute a gas to the nozzle.

In one embodiment of the present invention, the process gas may include at least one of $SiH_4$ gas, $H_2$ gas, Ar gas, and $NF_3$ gas.

In one embodiment of the present invention, the plasma generating apparatus may further include a power distribution unit to distribute power to the power electrodes connected in parallel to the power source. The power distribution unit supplies power to one power electrode at two or more positions.

In one embodiment of the present invention, the plasma generating apparatus may further include a power supply line connecting the power electrode to the power distribution unit.

In one embodiment of the present invention, length between the power source and a power supply position of the power electrode may be the same.

In one embodiment of the present invention, the power distribution unit may be disposed between a dielectric substance and a top plate of the vacuum container inside the vacuum container.

In one embodiment of the present invention, the power distribution unit may be disposed outside the vacuum container.

In one embodiment of the present invention, the power distribution unit includes power distribution lines to supply power to a plurality of points of the power electrode; and a guide portion disposed around the power distribution lines to be grounded.

In one embodiment of the present invention, the power electrode may include at least one hole on a surface facing the ground electrode.

In one embodiment of the present invention, a distance between the ground electrode and the power electrode may be 3 millimeters to 10 millimeters.

In one embodiment of the present invention, a frequency of the RF power source may be 13.56 MHz to 100 MHz.

In one embodiment of the present invention, the ground electrodes may include a taper portion increasing in width in a direction of the substrate and an extending portion having constant width.

In one embodiment of the present invention, the RF power may be supplied from a plurality of points of the power electrode.

A plasma generating apparatus according to an embodiment of the present invention may include a vacuum container; ground electrodes disposed inside the vacuum container and extending parallel to each other in a first direction; power electrodes disposed between the ground electrodes in a second direction intersecting the first direction; and a dielectric supporter on which the ground electrodes and the power electrodes are mounted. The power electrode has first height from a first surface contacting the dielectric supporter in a third direction orthogonal to the first direction and the second direction, has first thickness on the first surface contacting the dielectric supporter, and has second thickness at one end spaced in the third direction on the first surface. The ground electrode has second height from the first surface contacting the dielectric supporter, has third thickness on the first surface contacting the dielectric supporter, and has fourth thickness at one end spaced in the third direction on the first surface. The first thickness is greater than the second thickness, and the third thickness is smaller than the fourth thickness.

In one embodiment of the present invention, the first height may be greater than or equal to the second height.

In one embodiment of the present invention, one end of the ground electrodes and one end of the power electrodes may be rounded.

In one embodiment of the present invention, a vertical distance between the ground electrode and the power electrode may be constant.

A plasma generating apparatus according to an embodiment of the present invention may include a plurality of ground electrodes disposed parallel to each other inside a vacuum container and having a shape of truncated triangular prism; and power electrodes disposed inside the vacuum container and having a shape of truncated triangular prism interposed between the ground electrodes. A space between the ground electrode and the power electrodes includes a constant area. The power electrodes are connected to an RF power source.

A plasma generating apparatus according to an embodiment of the present invention may include a vacuum container; a ground electrode disposed inside the vacuum container; a power electrode disposed inside the container and spaced apart from the ground electrode; and a substrate holder facing the power electrode and the ground electrode. The power electrode is disposed on a plane on which the ground electrode is disposed and includes a discharge area where a distance between the ground electrode and the power electrode is constant. The discharge area obliquely contacts on a plane on which the power electrode is disposed. The power electrode is connected to an RF power source.

A substrate processing apparatus according to an embodiment of the present invention may include a vacuum container; a plurality of ground electrodes disposed inside the vacuum container and extending parallel to each other; power electrodes disposed inside the vacuum container and interposed between the ground electrodes; and a substrate holder disposed to face the ground electrodes and the power electrodes and supporting a substrate. A distance between the ground electrode and the power electrode includes a constant area. The power electrode is tapered in a direction facing the substrate. The power electrodes are connected to an RF power source.

In one embodiment of the present invention, a temperature of the substrate may be 50 to 250 degrees centigrade. A polysilicon thin film or an amorphous silicon thin film may be formed on the substrate.

A plasma generating apparatus according to an embodiment of the present invention may include a vacuum container including a top plate; a gas distribution unit disposed below the top plate; insulating supporters disposed below the gas distribution unit, including a plurality of nozzles to output a process gas received from the gas distribution unit, and extending parallel to each other in a first direction; ground electrodes disposed between the insulating supporters and extending in the first direction; and power electrodes disposed below the insulating supporter and extending parallel to each other in the first direction. RF power is applied to the power electrodes.

In one embodiment of the present invention, the nozzles may be disposed between the power electrode and the ground electrode.

In one embodiment of the present invention, the insulating supporter may include an upper insulating supporters and a lower insulating supporter disposed below the upper insulating supporter. The nozzle may include an upper nozzle penetrating the upper insulating supporter and a lower nozzle penetrating the lower insulating supporter.

In one embodiment of the present invention, a diameter of the upper nozzle may be greater than that of the lower nozzle.

In one embodiment of the present invention, the lower insulating supporter may be made of at least one of ceramic, alumina, and quartz. The upper insulating supporter may be made of at least one of Teflon and plastic.

In one embodiment of the present invention, the gas distribution unit may include an upper gas distribution plate disposed below the top plate and a lower gas distribution plate disposed below the upper gas distribution plate.

In one embodiment of the present invention, the lower gas distribution unit may include a first trench extending in the first direction on a top surface of the lower gas distribution plate and aligned with the nozzles disposed in the first direction; and preliminary nozzles disposed within the first trench and aligned with the nozzles.

In one embodiment of the present invention, the first trench may extend in a second direction orthogonal to the first direction to be connected to a pair of adjacent nozzles around the ground electrode.

In one embodiment of the present invention, the lower distribution plate may further include a through-hole for electrode connection disposed in the center of the first trench. Connection means may fixedly connect the lower distribution plate and the ground electrode to a hole formed in a top surface of the ground electrode through a through-hole for electrode connection.

In one embodiment of the present invention, the upper gas distribution plate may include a second trench extending a second direction intersecting the first direction on a top surface of the upper gas distribution plate; and a gas supply through-hole formed within the second trench and aligned with the first trench.

In one embodiment of the present invention, the power electrode and the ground electrode may include regions facing each other and having a constant distance from each other.

In one embodiment of the present invention, the power electrode and the ground electrode are tapered while keeping a constant distance.

In one embodiment of the present invention, one surface of the power electrode may be in contact with the insulating supporter and the other surface of the power electrode may be rounded. One surface of the ground electrode may be in contact with the gas distribution unit and the other end of the ground electrode may be rounded.

In one embodiment of the present invention, the power electrode may receive the RF power at two or more points in the first direction.

In one embodiment of the present invention, the plasma generating apparatus may further include power supply lines to supply power to the power electrode; an RF power source to supply the RF power; and a power distribution unit interposed between the RF power and the power supply line to distribute the RF power to the power electrodes. The power distribution unit may be disposed outside the vacuum container.

In one embodiment of the present invention, the plasma generating apparatus may further include fixed lines spaced apart from the power supply lines in the first direction. One end of the fixed lines may be fixedly connected to the power electrode, and the other end thereof is fixedly connected to the top plate.

In one embodiment of the present invention, the power electrode may include holes formed at its side surface.

A plasma generating apparatus according to an embodiment of the present invention may include a vacuum container including a top plate; a gas distribution unit disposed below the top plate; an insulating supporter disposed below the gas distribution unit and including a plurality of nozzle to output a process gas received from the gas distribution unit; ground electrodes disposed below the insulating supporter and extending parallel to each other in a first direction; and power electrodes disposed below the insulating supporter and extending parallel to each other. RF power is applied to the power electrodes.

In one embodiment of the present invention, the nozzles may be disposed between the power electrode and the ground electrode.

In one embodiment of the present invention, the insulating supporter may include an upper insulating supporter and a lower insulating supporter disposed below the upper insulating supporter. The nozzle may include an upper nozzle penetrating the upper insulating supporter and a lower nozzle penetrating the lower insulating supporter.

In one embodiment of the present invention, a diameter of the upper nozzle may be greater than that of the lower nozzle.

In one embodiment of the present invention, the lower insulating supporter may be made of at least one of ceramic, alumina, quartz, and the upper insulating supporter may be made of at least one of Teflon and plastic.

In one embodiment of the present invention, the gas distribution unit may include an upper gas distribution plate disposed below the top plate and a lower gas distribution plate disposed below the upper gas distribution plate.

In one embodiment of the present invention, the lower gas distribution plate may include a first trench extending in the first direction on a top surface of the lower gas distribution plate and aligned with the nozzles disposed in the first direction and preliminary nozzle disposed within the first trench and aligned with the nozzles.

In one embodiment of the present invention, the first trench may extend in a second direction intersecting the first direction to be connected to a pair of adjacent nozzles around the ground electrode.

In one embodiment of the present invention, the lower gas distribution plate may further include a through-hole for electrode connection disposed in the center of the first trench. Connection means may fixedly connect the lower gas distribution plate and the ground electrode to a hole formed on a top surface of the ground electrode through the through-hole for electrode connection and a through-hole formed at the insulating supporter.

A substrate processing apparatus according to an embodiment of the present invention may include a vacuum container including a top plate; a gas distribution unit disposed below the top plate; insulating supporters disposed below the gas distribution unit, including a plurality nozzles to output a process gas received from the gas distribution unit, extending parallel to each other in a first direction; ground electrodes disposed between the insulating supporters and extending parallel to each other in the first direction; power electrodes disposed below the insulating supporter and extending parallel to each other in the first direction; and a substrate holder disposed below the power electrodes. RF power is applied to the power electrodes.

A substrate processing apparatus according to an embodiment of the present invention may include a vacuum container including a top plate; a gas distribution unit disposed below the top plate; an insulating supporter disposed below the gas distribution unit and including a plurality nozzles to output a process gas received from the gas distribution unit; ground electrodes disposed below the insulating supporters and extending parallel to each other in the first direction; power electrodes disposed below the insulating supporter and extending parallel to each other in the first direction; and a substrate holder disposed below the power electrodes. RF power is applied to the power electrodes.

A plasma generating apparatus according to an embodiment of the present invention may include a vacuum container including a top plate; a gas distribution unit disposed below the top plate and including a plurality of nozzles to output a process gas; insulating supporters disposed below the gas distribution unit and extending parallel to each other in a first direction; ground electrodes disposed below the gas distribution unit and extending in the first direction; power electrodes disposed below the insulating supporter and extending parallel to each other in the first direction; and a power supply unit to supply RF power to the power electrodes through the gas distribution unit and the insulating supporter.

In one embodiment of the present invention, the gas distribution unit may include spacers arranged at regular intervals and extending in the first direction. The spacer may be disposed between the insulating supporters, and the nozzles may be disposed through the spacer.

In one embodiment of the present invention, thickness of the insulating supporters may be equal to height of the spacer.

In one embodiment of the present invention, the insulating supporter may include an upper insulating plate and a lower insulating plate aligned with the upper insulating plate and disposed below the upper insulating plate.

In one embodiment of the present invention, the gas distribution unit may include an upper gas distribution plate and a lower gas distribution plate disposed below the upper gas distribution plate.

In one embodiment of the present invention, the lower gas distribution plate includes a first trench extending in the first direction on a top surface of the lower gas distribution plate and connected to the nozzles.

In one embodiment of the present invention, the lower gas distribution plate may include a first trench extending in the first direction on a top surface of the lower gas distribution plate and connected to the nozzles.

In one embodiment of the present invention, the lower distribution plate may further include a through-hole for electrode connection disposed in the center of the first trench.

In one embodiment of the present invention, the upper gas distribution plate may include a second trench extending in a second direction intersecting the first direction on a top surface of the upper gas distribution plate; and a gas supply through-hole formed within the second trench and aligned with the first trench.

In one embodiment of the present invention, the ground electrodes may include a protrusion extending in the first direction in the center of a top surface of the ground electrode, and the process gas may be supplied to both sides of the protrusion through the nozzles.

In one embodiment of the present invention, the ground electrode and the power electrode may be tapered such that a distance therebetween is constant to a predetermined region.

In one embodiment of the present invention, the power supply unit may include a power supply line connected to the power electrode; a first insulating member surrounding the power supply line and hooked by a projection of a through-hole formed at the top plate; and a second connection member disposed on the first insulating member and inserted into the through-hole of the top plate.

In one embodiment of the present invention, the plasma generating apparatus may further include a power distribution unit to distribute RF power to the power supply unit. The power distribution unit includes a base plate having a penetrating power distribution pattern; a lower insulating pattern inserted into the power distribution pattern of the base plate; an upper insulating pattern disposed on the lower insulating pattern; a power distribution line disposed on the upper insulating pattern; and a power distribution top plate covering a top surface of the base plate. The power supply unit distributes RF power to the power distribution lines.

In one embodiment of the present invention, the plasma generating apparatus may further include a fixed supporter. The fixed supporter includes a fixed line connected to the power electrode; a third insulating member surrounding the fixed line and hooked by a projection of the through-hole formed at the top plate; and a fourth connection member disposed on the third insulating member and inserted into the through-hole of the top plate.

A plasma generating apparatus according to an embodiment of the present invention may include a vacuum container including a top plate; insulating supporters extending parallel to each other in below the top plate in a first direction and spaced apart from each other in a second direction intersecting the first direction; a gas distribution unit filling a space between the insulating supporters and disposed on the insulating supporters; power electrodes disposed below the insulating supporters and extending in the first direction; and ground electrodes disposed below the space between the insulating supporters and extending in the first direction.

In one embodiment of the present invention, the gas distribution unit may include a plurality of nozzles, and the nozzles may be formed through the space between the insulating supporters.

In one embodiment of the present invention, the gas distribution unit may include an upper gas distribution plate and a lower gas distribution plate disposed below the upper gas distribution plate.

In one embodiment of the present invention, the lower gas distribution plate may include a first trench extending in the first direction on a top surface of the lower gas distribution plate and connected to the nozzles.

In one embodiment of the present invention, the insulating supporter may include a plurality of nozzles. The nozzles may be disposed between the ground electrode and the power electrode through the insulating supporter.

In one embodiment of the present invention, the plasma generating apparatus may further include a power supply unit to supply power from a plurality of points of the power electrodes. The power supply unit may include a power supply line connected to the power electrode; a first insulating member surrounding the power supply line and hooked by a projection of a through-hole formed at the top plate; and a second insulating member disposed on the first insulating member and inserted into the through-hole of the top plate.

In one embodiment of the present invention, the plasma generating apparatus further include a power distribution unit to distribute RF power to the power supply unit. The power distribution unit may include a base plate having a penetrating power distribution pattern; a lower insulating pattern inserted into the power distribution pattern of the base plate; an upper insulating pattern disposed on the lower insulating pattern; a power distribution line disposed on the upper insulating pattern; and a power distribution top plate covering a top surface of the base plate. The power supply unit may distribute RF power to the power distribution lines.

A substrate processing apparatus according to an embodiment of the present invention may include a vacuum container including a top plate; a gas distribution unit disposed below the top plate and including a plurality nozzles to output a process gas received from the gas distribution unit; insulating supporters disposed below the gas distribution unit and extending parallel to each other in first direction; ground electrodes disposed below the gas distribution unit and extending parallel to each other in the first direction; power electrodes disposed below the insulating supporter and extending parallel to each other between the ground electrodes in the first direction; a substrate holder disposed below the ground electrodes and the power electrodes; and a power supply unit to supply RF power to the power electrodes through the gas distribution unit and the insulating supporter.

A substrate processing apparatus according to an embodiment of the present invention may include a vacuum container including a top plate; insulating supporters extending parallel to each other below the top plate in a first direction and spaced apart from each other in a second direction intersecting the first direction; a gas distribution unit filing a space between the insulating supporters and disposed on the insulating supporters; power electrodes disposed below the insulating supporter and extending in the first direction; and ground electrodes disposed below the space between the insulating supporters and extending in the first direction; and a substrate holder disposed below the power electrodes and the ground electrodes and mounting a substrate thereon.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

Figure 1:
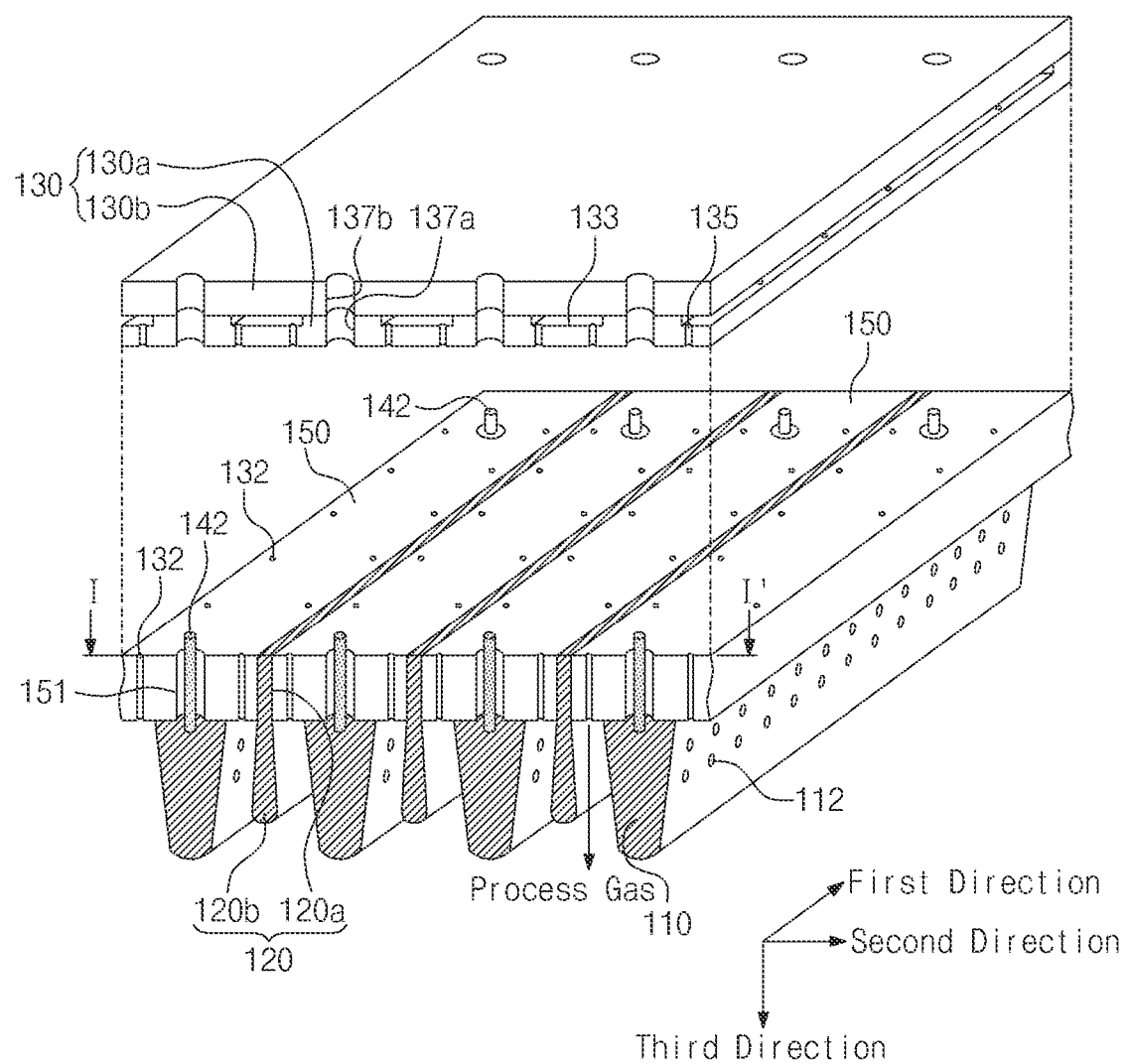
FIG. 1 is a partial perspective view of a plasma generating apparatus according to an embodiment of the present invention.

110: Power electrode 120: Ground electrodes 130: Gas distribution unit

150: Dielectric supporter 140: Power distribution unit

160: impedance matching network 170: RF power source

1110: Power electrode 1120: Ground electrodes 1130: Gas distribution unit

1150: Dielectric supporter 1140: Power distribution unit

1160: impedance matching network 1170: RF power source

2110: Power electrode 2120: Ground electrodes 2130: Gas distribution unit

2150: Dielectric supporter 2250: Power distribution unit

2160: impedance matching network 2170: RF power source

DETAILED DESCRIPTION OF EMBODIMENTS

In a large-area (1 m×1 m or larger) flat panel display process or a solar cell process, density of capacitively coupled plasma may not be uniform due to the standing wave effect. The standing wave effect may cause plasma uniformity to decrease.

In a solar cell process using polysilicon, a high growth rate and a low lattice defect density of the polysilicon are required. Therefore, a polysilicon plasma deposition apparatus with a low lattice defect density, a high growth rate and process uniformity is the most important solution for thin-film solar cells.

With the increase in driving frequency of capacitively coupled plasma, ion bombardment energy may decrease, electron density may increase, and electron temperature may decrease. However, since the increase in the driving frequency causes the standing wave effect to increases, plasma uniformity may decrease. Accordingly, there is a need for a method of obtaining high-density and uniform plasma at a frequency of 13.56 MHz or higher.

A plasma generating apparatus according to an embodiment of the present invention applies RF power of 13.56 MHz to 200 MHz to a plurality of line-shaped power electrodes. The power electrodes are supplied with power at a plurality of positions to decrease the standing wave effect, respectively. Left and right current distributions may be symmetrical to the power supply position. A ground electrode is disposed between the power electrodes. Since plasma may be generated between the power electrode and the ground electrode, a substrate may remain in a floating state. The substrate may mitigate a impact of plasma to reduce a lattice defect density. The ground electrode may provide separated discharges due to separated power electrodes, and eliminate the standing wave effect in a direction perpendicular to a lengthwise direction of the electrode.

When the power electrodes and the ground electrodes extend parallel to each other, a pattern of the power electrodes may be formed on a surface of the substrate. Thus, process uniformity may be reduced. Shapes of the power electrodes and the ground electrodes have an influence on the process uniformity. Further, increase in a distance between the power electrode and the substrate may increase process uniformity. However, the increase in a distance between the power electrode and the substrate may reduce process speed. Accordingly, there is a requirement for a novel structure of the power electrodes and the ground electrode to provide high process speed and high process uniformity.

The present invention will now be described more fully hereinafter with reference to the accompanying drawings, in which preferred embodiments of the present invention are shown. However, the present invention may be embodied in many different forms and should not be construed as limited to the embodiments set forth herein. Rather, these embodiments are provided so that this disclosure will be thorough and complete, and will fully convey the scope of the present invention to those skilled in the art. In the drawings, elements or components are exaggerated for clarity. Like numbers refer to like elements throughout.

[First Structure]

FIG. 1 is a partial perspective view of a plasma generating apparatus according to an embodiment of the present invention.

Figure 2:
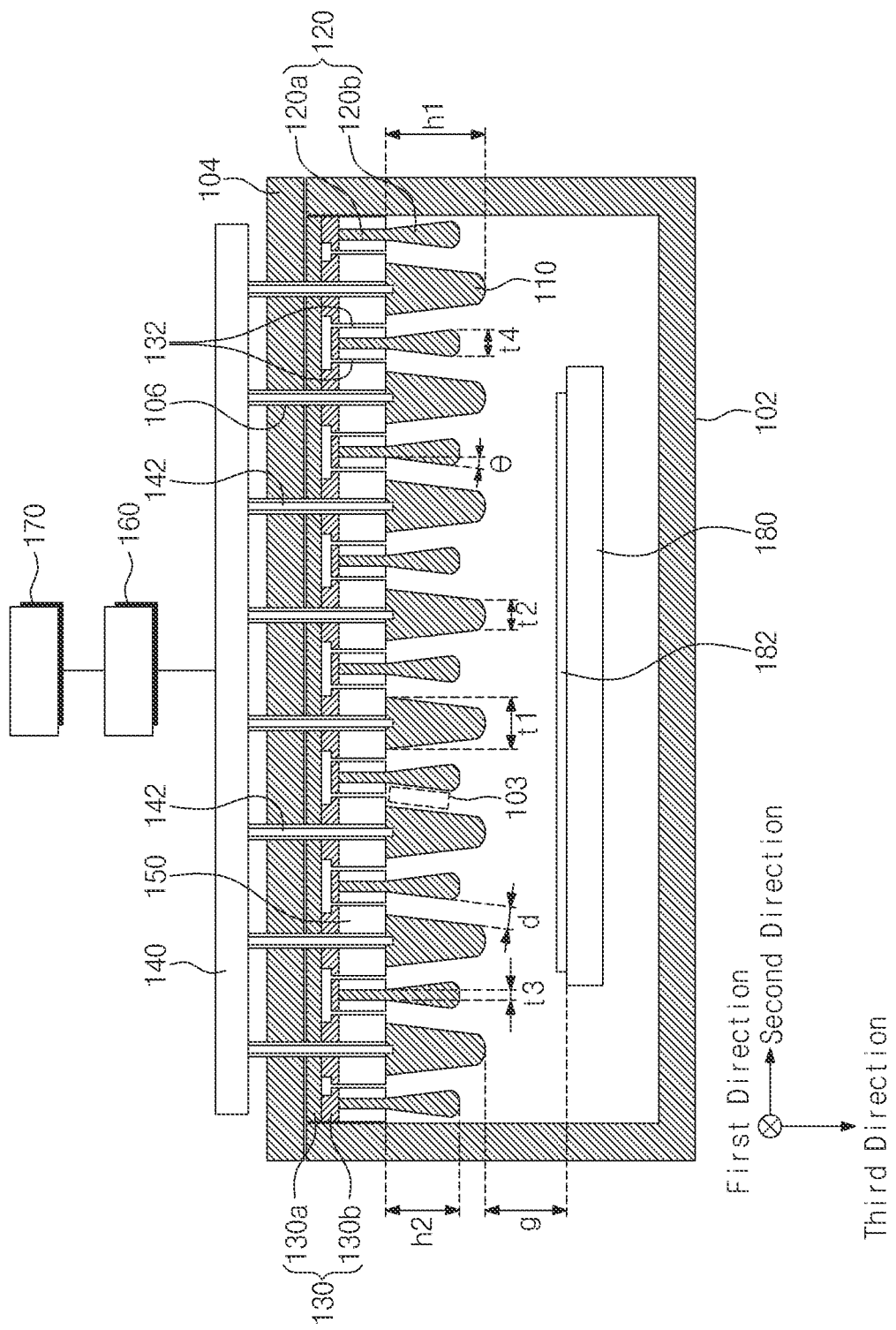
FIG. 2 is a cross-sectional view taken along line I-I' in FIG. 1.

FIG. 2 is a cross-sectional view taken along line I-I' in FIG. 1.

Figure 3:
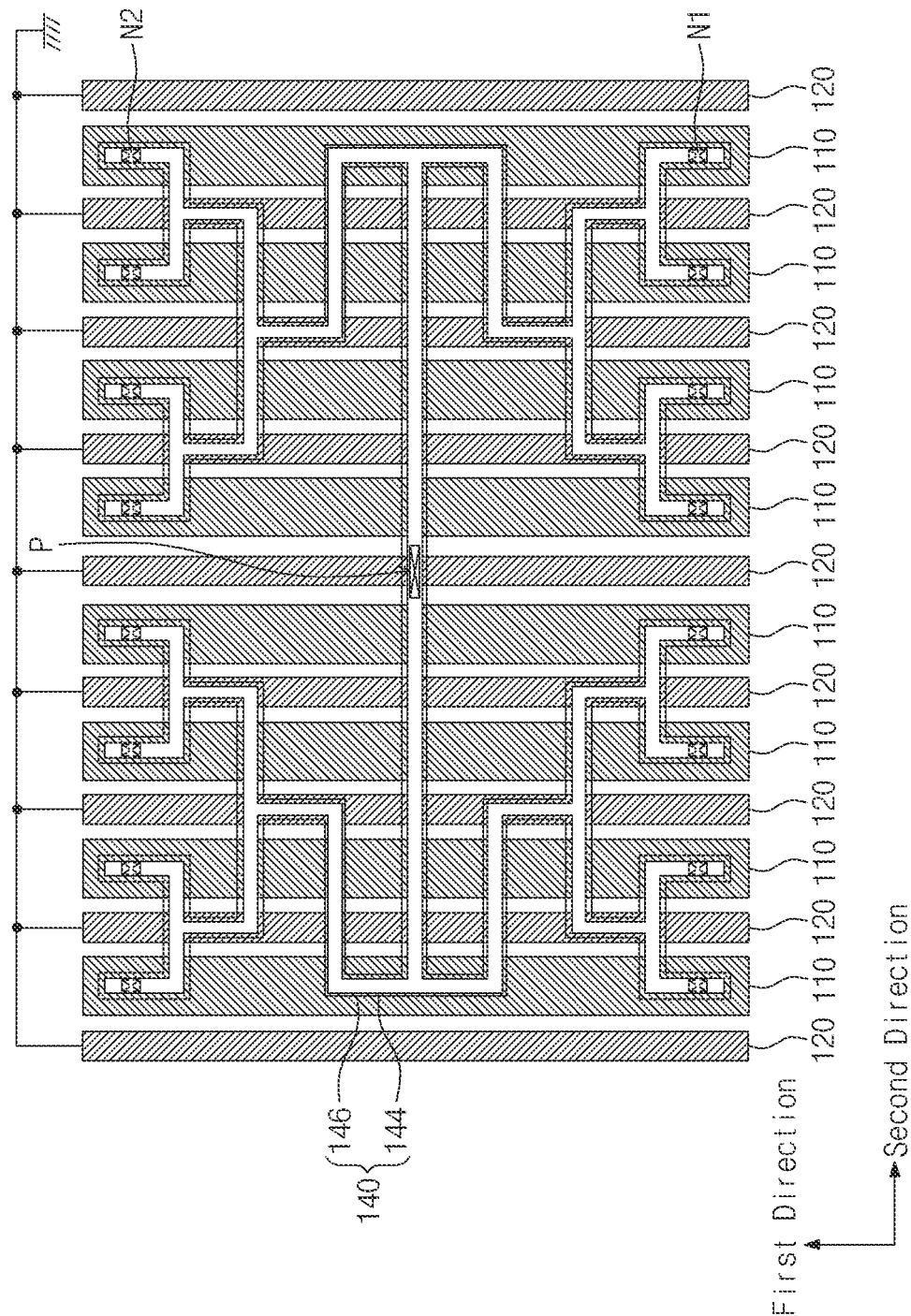
FIG. 3 is a top plan view of a power distribution unit.

FIG. 3 is a top plan view of a power distribution unit.

Referring to FIGS. 1 to 3, the plasma generating apparatus includes a plurality of ground electrodes 120 arranged inside a vacuum container 102 and extending parallel to each other and at least one power electrode 110 arranged between the ground electrodes. An area where a space "d" between the ground electrode 120 and the power electrode 100 is constant exists, and the power electrodes 110 are tapered in a direction facing a substrate 182. The power electrodes 120 are connected to an RF power source.

The vacuum container 102 may have a pressure less than atmospheric pressure. The vacuum container 102 may have a shape of rectangular parallelepiped. The vacuum container 102 may include a top plate 104.

A gas inlet (not shown) and a gas outlet (not shown) may be disposed at the vacuum container 120. The inlet allows a process gas to be supplied to the vacuum container 120. The gas outlet allows a process gas and reactive byproducts of the vacuum container 120 to be exhausted to the outside. The plasma generating apparatus may form amorphous or polycrystalline silicon on the substrate 182. A pressure of the vacuum container 102 may be hundreds of milliTorr (mTorr) to several Torr.

The substrate 182 may be disposed on a substrate holder 180. The substrate holder 180 may be disposed to face the top plate 104. The substrate 182 may be disposed parallel to the top plate 104. The substrate 182 may be a semiconductor substrate, a glass substrate, or a dielectric substrate. The substrate 182 may be a quadrangular substrate. A material deposited on the substrate 182 may be amorphous or polycrystalline silicon. The substrate holder 180 may include a heating unit (not shown). The heating unit may heat the substrate 182. A temperature of the substrate 182 may be from a room temperature to 300 degrees centigrade. The substrate 182 or the substrate holder 180 may be electrically floated. A gap "g" between the substrate 182 and the power electrode 110 may be several centimeters (cm) to tens of centimeters (cm).

The top plate 104 may be disposed on a top surface of the vacuum container 102. The top plate 104 may be a metal. The top plate 104 may be aluminum or stainless steel. The top plate 104 may have a shape of square plate. The top plate 104 and the vacuum container 102 may closely contact each other to be maintained at vacuum. The top plate 104 may include a plurality of through-holes 106. A power supply line 142 is disposed at the through-hole 106. The power supply line 142 electrically connects a power distribution unit 140 with the power electrode 110. The power supply line 142 may support the power electrode 110.

A dielectric supporter 150 is disposed below the top plate 104. The dielectric supporter 150 may include at least one of alumina, ceramic, quartz, Teflon, PEEK, and silicon. The dielectric supporter 150 may be a single-layer unit or a multi-layer unit. The dielectric supporter 150 may be disposed parallel to the top plate 104. The dielectric supporter 150 may include nozzles to supply a process gas between the power electrode 110 and the ground electrode 120. The nozzles 132 may be arranged at regular intervals in a first direction in which the power electrode 110 extends.

The ground electrode may be disposed between the dielectric supporters 150 to extend in the first direction. Thus, the dielectric supporter 150 may have a shape of band extending in the first direction. The nozzles 132 may be disposed on the edges of both sides of the dielectric supporter 150.

A gas distribution unit 130 may be disposed between the dielectric supporter 150 and the top plate 104. The gas distribution unit 130 may externally receive a process gas and supply the process gas to the nozzles 132 between the ground electrode 120 and the power electrode 110. The process gas may include hydrogen gas (H2) and silane (SiH4).

The gas distribution unit 130 includes preliminary nozzles 135, a lower gas distribution plate 130a where the preliminary nozzles 135 are disposed, and a upper gas distribution plate 130b disposed on the lower gas distribution plate 130a. The preliminary nozzles 135 may be aligned with the nozzles 132. The preliminary nozzles 135 may be aligned in the first direction.

The lower gas distribution plate 130a may have a trench in a region in which the preliminary nozzles 135 are disposed. The preliminary nozzles 135 may be disposed within the trench 133. The preliminary nozzles 135 aligned in the first direction and preliminary nozzles 135 disposed to be spaced in a second direction may be disposed within the trench 133. The lower gas distribution plate 130a may include lower through-holes 137a. The upper gas distribution plate 130b may include upper through-holes 137b aligned with the lower through-holes 137a.

The dielectric supporter 150 may include a through-hole 151. The through-hole 151 may be aligned with the lower through-hole 137a. The power supply line 142 is connected to the power electrode 110 through the upper through-hole 137b, the lower through-hole 137a, and the through-hole 151.

The upper gas distribution plate 130b and the lower gas distribution plate 130a are coupled to each other. Thus, the process gas is supplied through the trench 133, the preliminary nozzles 135, and the nozzles 132.

The ground electrodes 120 may extend parallel to each other in the first direction. The ground electrodes 120 may be spaced apart from each other at regular intervals. The ground electrode 120 may have a shape of prism or triangular prism. As long as an area 103 where a distance "d" between the ground electrode 120 and the power electrode 110 is constant exists, the shape of the ground electrode 120 and the shape of the power electrode 110 may be variously changed.

The ground electrodes 120 may be arranged in the second direction intersecting the first direction. A plane defined by the first direction and the second direction may be parallel to a plane on which the top plate 104 is disposed.

The ground electrode 120 may be divided into an exposed ground electrode 120b exposed inside the vacuum container 102 and a buried ground electrode 120a buried in the dielectric supporter 150. The buried ground electrode 120a may be inserted into the dielectric supporter 150.

Width of one end of the exposed ground electrode 120b is t3, and width of the other end of the exposed ground electrode 1201b is t4. The width t4 is greater than the width t3. The other end of the exposed ground electrode 120b may face the substrate 182. Thus, the exposed ground electrode 120b may be tapered. The other end of the exposed ground electrode 120b may be rounded. A third direction is perpendicular to a surface defined by the first direction and the second direction. An angle θ between the third direction and one surface of the exposed ground electrode 120b may be 5 degrees to 15 degrees.

The power electrode 110 may be attached to the dielectric supporter 150. The power electrode 110 extends in a lengthwise direction of the ground electrode 120. The power electrode 110 may be a conductive material. The power electrodes 110 may extend parallel to each other in the first direction. The power electrodes 110 may be arranged to be spaced apart from each other in the second direction. The number of the power electrodes 110 may be even.

On a surface that is in contact with the dielectric supporter 150, width of one end of the power electrode 110 is t1 and width of the other end of the power electrode 110 is t2. The width 12 is smaller than the width t1. A distance "d" between the power electrode 110 and the ground electrode 120 may be constant. The distance "d" between the power electrode 110 and the ground electrode 120 may be 3 millimeters (mm) to 10 millimeters (mm). If the distance "d" is less than 3 mm, it may be difficult to perform discharge. If the distance "d" exceeds 10 mm, process uniformity may be reduced due to discharge. The other end of the power electrode 110 may be rounded. Height h1 of an exposed power electrode may be greater than or equal to height h2 of an exposed ground electrode.

The power electrodes 110 may include one or more holes 112 at a surface facing the ground electrode 120. The holes 112 are regularly arranged. The holes 112 may cause hollow cathode discharge. The holes 112 may be aligned in the first direction.

In capacitively coupled plasma, plasma density may increases with the increase in frequency of the RF power source 170. However, the standing wave effect may increase with the increase in frequency of the RF power source 170. The standing wave effect may restrict plasma uniformity and process uniformity. Supplying RF power to nodes N1 and N2 of the power electrode 110 may reduce the standing wave effect. A plasma density distribution may vary depending on a position where the RF power is supplied to the power electrode 110.

The power electrodes 110 may be equally divided into N parts. The RF power is supplied to the center of the N parts of the power electrode 110. That is, the nodes N1 and N2 of the power electrode 110 may be disposed in the center of the divided parts. A current distribution and/or a voltage distribution of the power electrode 110 may be symmetrical to the center of the power electrode 110.

For example, the power electrodes 110 may include the nodes N1 and N2. The nodes N1 and N2 may supply the RF power source 170 to the power electrode 110. The nodes N1 and N2 include a first node N1 and a second node N2. A length of the power electrode 140 is L. The first node N1 may be disposed at a position of L/4, and the second node N2 may be disposed at a position of 3L/4. Current may have a maximum value at the nodes N1 and N2, and a voltage may have a minimum value at the nodes N1 and N2. A distribution of the current or the voltage may be horizontally symmetrical to the nodes N1 and N2. Phases of voltages at the nodes N1 and N2 may be in-phase.

Positions of the nodes N1 and N2 may be changed to have process uniformity of the first direction.

Plasma may be generated between the power electrode 110 and the ground electrode 120. A distance "d" between the power electrode 110 and the ground electrode 120 may be 3 mm to 15 mm. A structure where the power electrode 110 and the ground electrode 120 are adjacent to each other may enhance stability of plasma. In addition, the structure may reduce a potential of the plasma and/or a DC bias. The substrate may be floated to allow the plasma generating apparatus to provide a low lattice defect during a deposition process.

A tapered power electrode 110 and a tapered ground electrode 120 may improve a flow pattern of process gas. With t1 of one end of the power electrode 110 is greater than width t2 of the other end of the power electrode 110. Thus, the power supply line 142 may be easily coupled with the power electrode 110. Moreover, a process speed may be improved by increasing a discharge area.

A curvature-type power electrode 110 and a curvature-type ground electrode 120 may improve a flow pattern of process gas. The curvature-type power electrode 110 and the curvature-type ground electrode 120 may suppress arc discharge.

The height h1 of the power electrode 110 may be greater than the height h2 of the ground electrode 120. Thus, process uniformity and process speed may be ensured at a pressure of 5 Torr or less.

Preferably, width t2 of the other end of the power electrode 110 may be about 10 mm. Preferably, width of the other end of the exposed ground electrode 120b may be about 10 mm. Preferably, a distance "d" between the power electrode 110 and the ground electrode 120 may be 3 mm to 15 mm. The substrate 182 may be minimally exposed to plasma. That is, the plasma generating apparatus may generate remote plasma and a radical may be supplied to the substrate 182.

The power distribution unit 140 may be means for receiving power of the RF power source 170 from the powered terminal P and transferring the power to the power electrodes 110. The power distribution unit 140 may include a power distribution line 144 and a guide unit 146 disposed around the power distribution unit 144. The guide unit 146 is grounded. Thus, the power distribution line 144 and the guide unit 146 may form a transmission line. The power distribution unit 140 may be disposed outside the vacuum container 102.

According to a modified embodiment of the present invention, the power distribution unit 140 may be disposed inside the vacuum container 102. The power distribution unit 140 may be disposed between the top plate and the gas distribution unit.

The power supply line 142 electrically connects the power distribution line 144 to the power electrode 110. The power supply line 142 may support the power electrode 110. A plurality of power supply lines 142 may be connected to one power electrode 110. Thus, the power electrode 110 may receive power in-phase at a plurality of positions.

The RF power source 170 supplies power to the power distribution line 144 through an impedance matching network 150. A distance between the power supply lines 142 and a power supply point of the RF power source 170 is constant. Thus, the power supply line 142 may supply power in-phase to all the power electrodes 110. A frequency of the RF power source 170 may be 1 MHz or more. Preferably, the frequency of the RF power source 170 may be 13.56 MHz to 50 MHz. The impedance matching network 160 may be means for maximally transferring the power of the RF power source 170 to a load.

Figure 4:
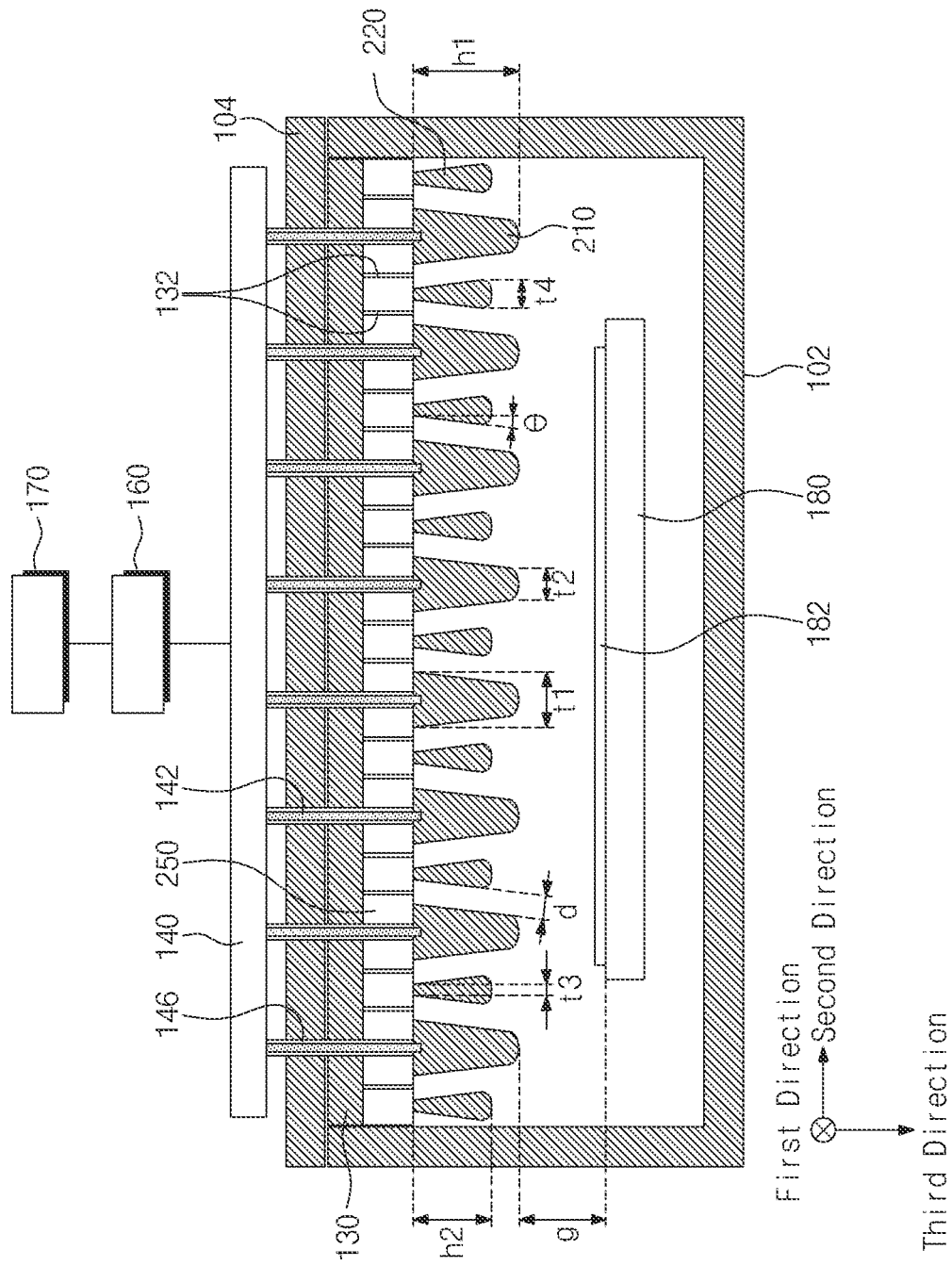
FIG. 4 illustrates a plasma generating apparatus according to another embodiment of the present invention.

FIG. 4 illustrates a plasma generating apparatus according to another embodiment of the present invention. In FIG. 4, sections different from FIGS. 1 to 3 will be extensively explained to avoid duplicate explanation.

Referring to FIG. 4, the plasma generating apparatus includes a vacuum container 102, ground electrodes 220 disposed inside the vacuum container 102 and extending parallel to each other in a first direction, power electrodes 210 disposed between the ground electrodes 220 in a second direction intersecting the first direction, and a dielectric supporter 250 on which the ground electrodes 220 and the power electrodes 210 are mounted.

The power electrode 210 has first height h1 from a first surface contact with the dielectric supporter 250 in a third direction perpendicular to the first direction and the second direction. The power electrode 210 has first thickness t1 on the first surface contact with the dielectric supporter 250. The power electrode 210 has second thickness t2 at one end spaced in the third direction on the first surface.

The ground electrode 220 has second height h2 from the first surface contact with the dielectric supporter 250. The ground electrode 220 has third thickness t3 on the first surface contact with the dielectric supporter 250. The ground electrode 220 has fourth thickness t4 at one end spaced in the third direction on the first surface. The first thickness t1 is greater than the second thickness t2, and the third thickness t3 is smaller than the fourth thickness t4. A perpendicular distance "d" between the ground electrode 220 and the power electrode 210 is constant.

The first height h1 may be greater than or equal to the second height h2. One end of the ground electrodes 220 and one end of the power electrodes may be rounded. An angle between an exposed side surface of the power electrode 210 and the third direction may be 5 degrees to 15 degrees. Alternatively, an angle between an exposed surface of the ground electrode 220 and the third direction may be 5 degrees to 15 degrees.

The power electrode 210 may have a shape of truncated triangular prism. The ground electrode 220 may have a shape of truncated triangular prism. The ground electrode 220 may be upside-down coupled to the dielectric supporter

250 such that a distance "d" between the power electrode 210 and the ground electrode 220 is constant.

The dielectric supporter 250 may include a plurality of nozzles 132 arranged in a first direction. The nozzles 132 may supply a process gas between the power electrode 210 and the ground electrode 220. The dielectric supporters 250 may not be separated from each other, i.e., may be integrated in a body. The ground electrode 220 and the power electrode 220 may be disposed in contact with a bottom surface of the dielectric supporter 250.

According to a modified embodiment of the present invention, a portion of the power electrode 210 and a portion of the ground electrode 220 may be inserted into the dielectric supporter 250.

Figure 5:
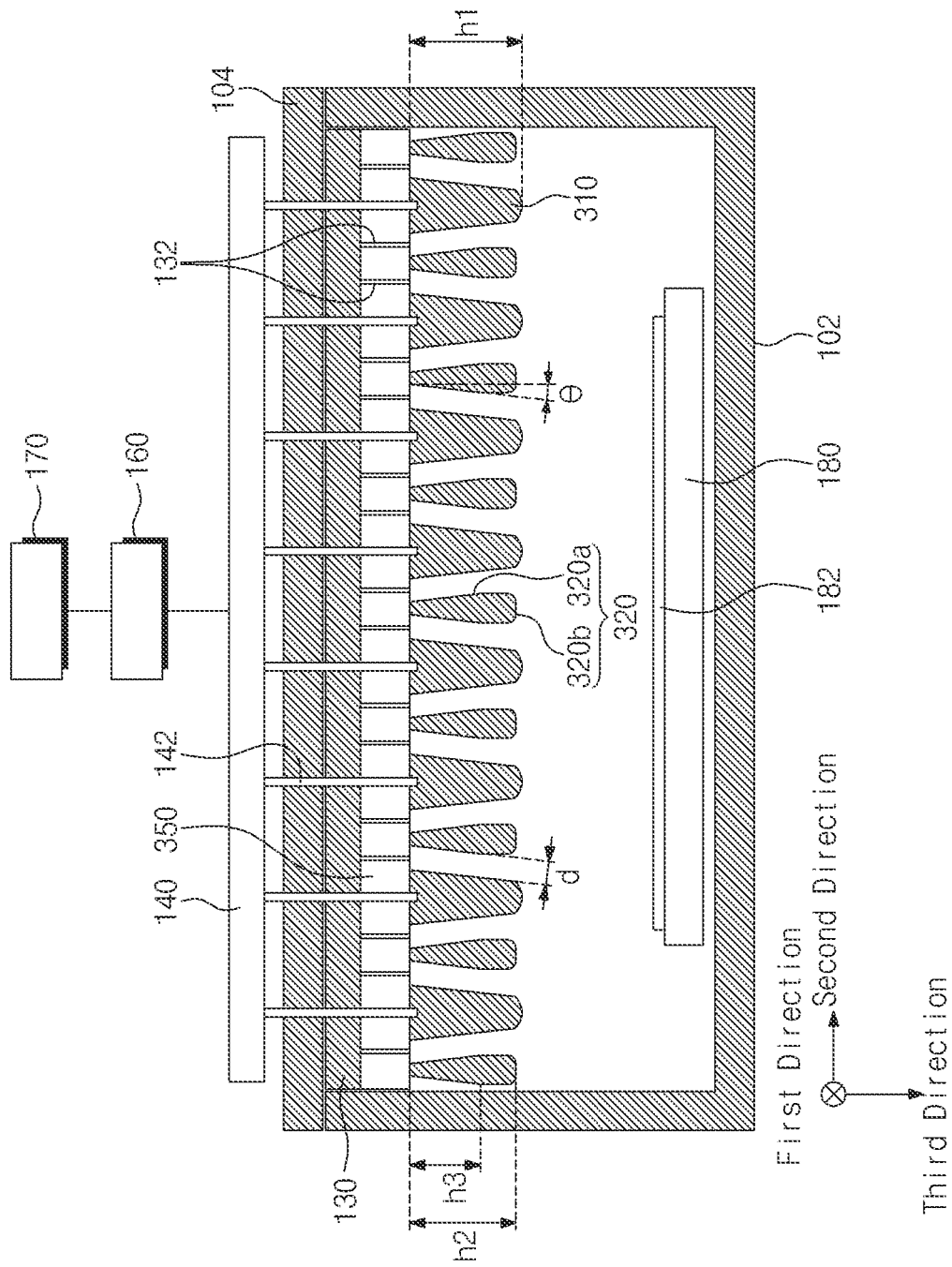
FIG. 5 illustrates a substrate processing apparatus according to an embodiment of the present invention.

FIG. 5 illustrates a substrate processing apparatus according to an embodiment of the present invention. In FIG. 5, sections different from FIGS. 1 to 18 will be extensively explained to avoid duplicate explanation.

Referring to FIG. 5, the substrate processing apparatus includes a plurality of ground electrodes 320 disposed inside a vacuum container 102 and extending parallel to each other, power electrodes 310 disposed inside the vacuum container 102 and interposed between the ground electrodes 320, and a substrate holder 180 disposed to face the ground electrodes 320 and the power electrodes 310 and holding a substrate 182.

An area where a distance "d" between the ground electrode 320 and the power electrode 310 is constant exists. The power electrode 310 is tapered in a direction facing the substrate 182. The power electrodes 310 are connected to an RF power source 170.

The ground electrode 320 includes a taper portion 320a whose width increases in a direction of the substrate 182 and an extending portion 320b having a constant width. The ground electrode 320 and the power electrode 310 may be disposed on a bottom surface of a dielectric supporter 350.

[Second Structure]

When power electrodes and ground electrodes extend parallel to each other, a pattern of the power electrodes may be formed on a surface of a substrate. Thus, process uniformity may be reduced. Shapes of the power electrodes and the ground electrodes may have an effect on process uniformity of the substrate. In addition, increase in distance between the power electrode and the substrate results in increase in process uniformity. However, the increase in distance between the power electrode and the substrate results in decrease in process speed. Accordingly, there is a requirement for a novel structure of the power electrodes and the ground electrode to provide high process speed and high process uniformity. As a result, a plasma generating apparatus according to an embodiment of the present invention proposes an inclined electrode structure. Furthermore, since a distance between the power electrode and the ground electrode is short, a novel gas distribution structure is required.

Figure 6:
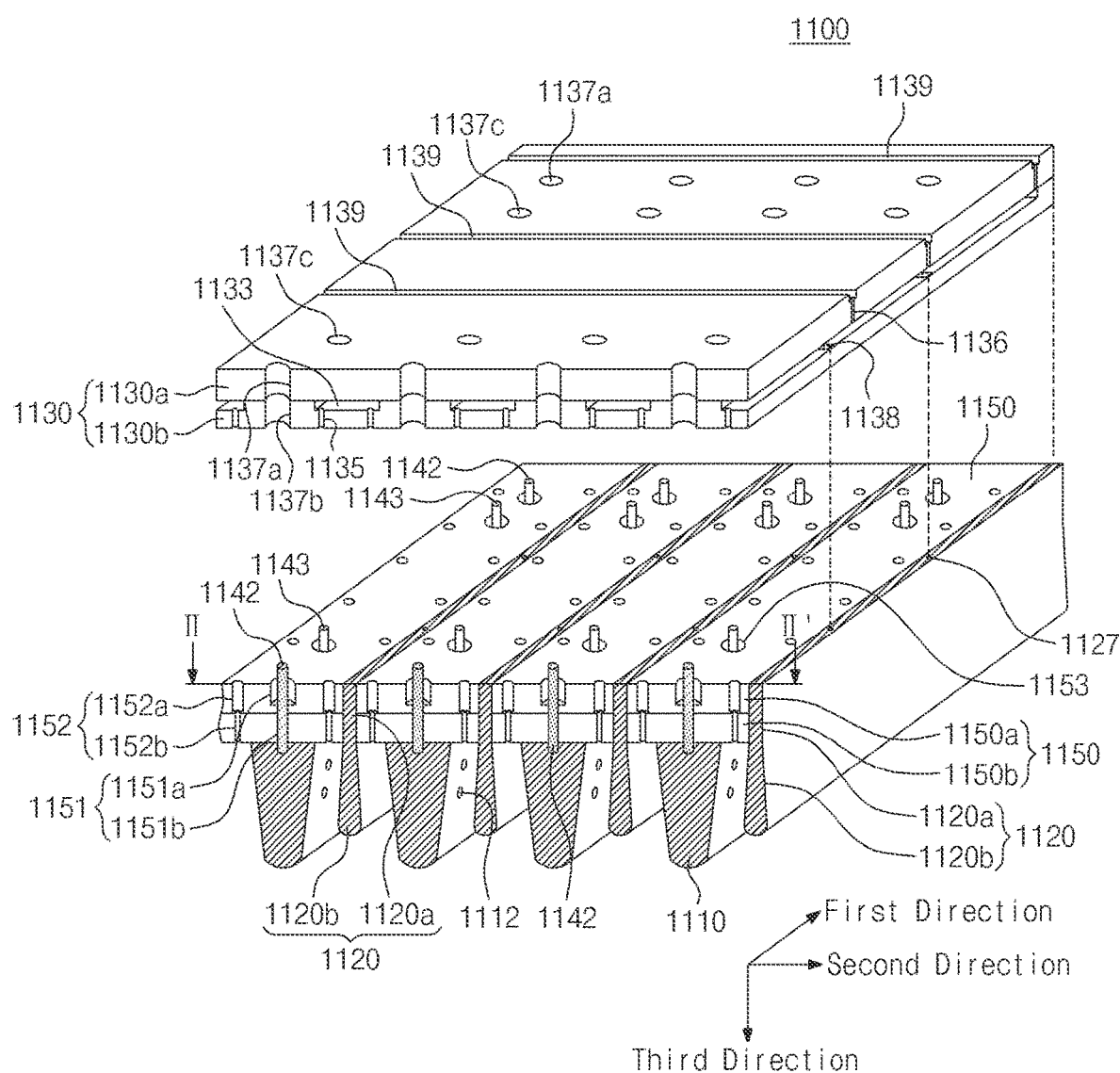
FIG. 6 is a partial perspective view of the plasma generating apparatus according to another embodiment of the present invention.

FIG. 6 is a partial perspective view of the plasma generating apparatus 1100 according to another embodiment of the present invention.

Figure 7:
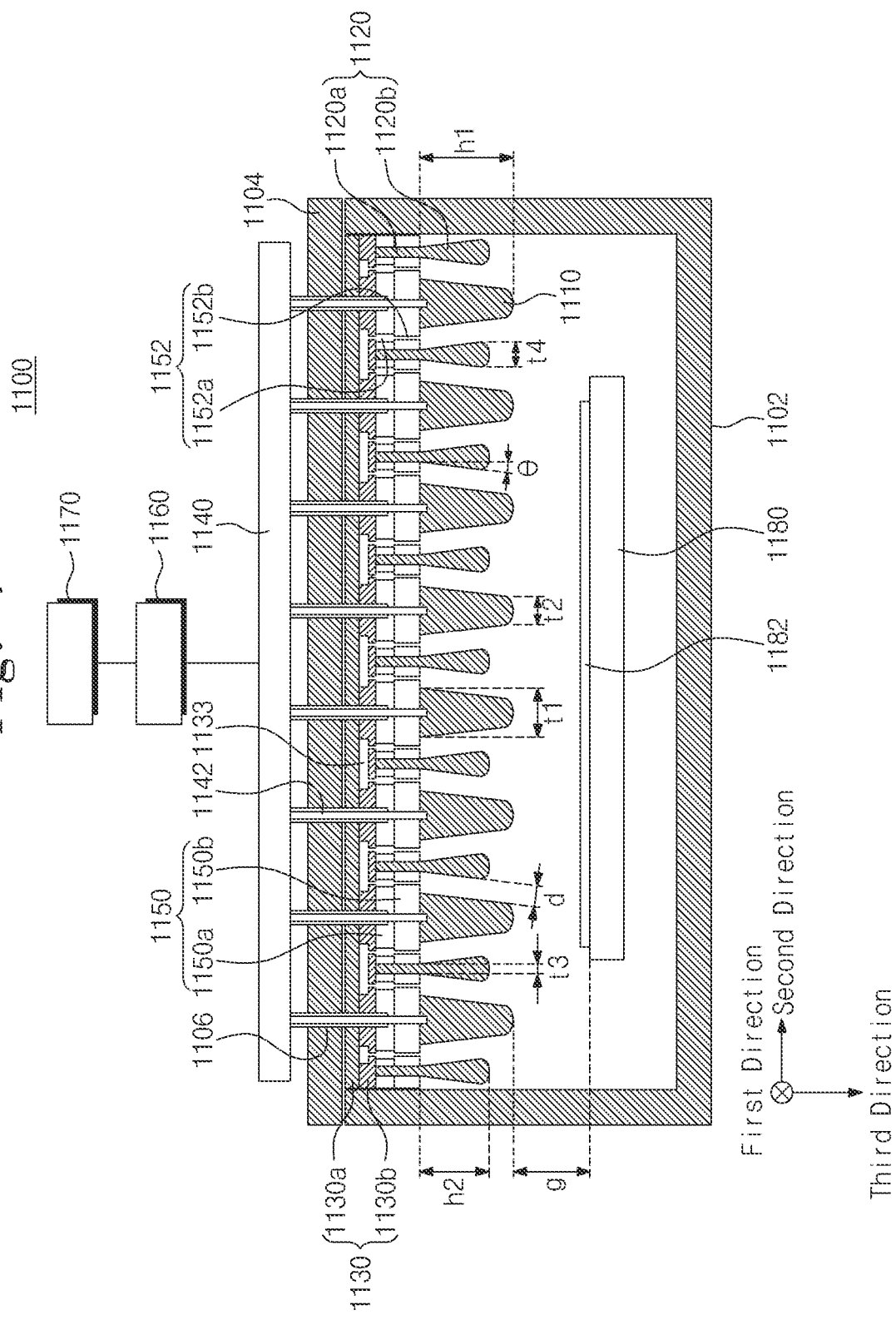
FIG. 7 is a cross-sectional view taken along the line II-II' in FIG. 6.

FIG. 7 is a cross-sectional view taken along the line II-II' in FIG. 6.

Figure 8:
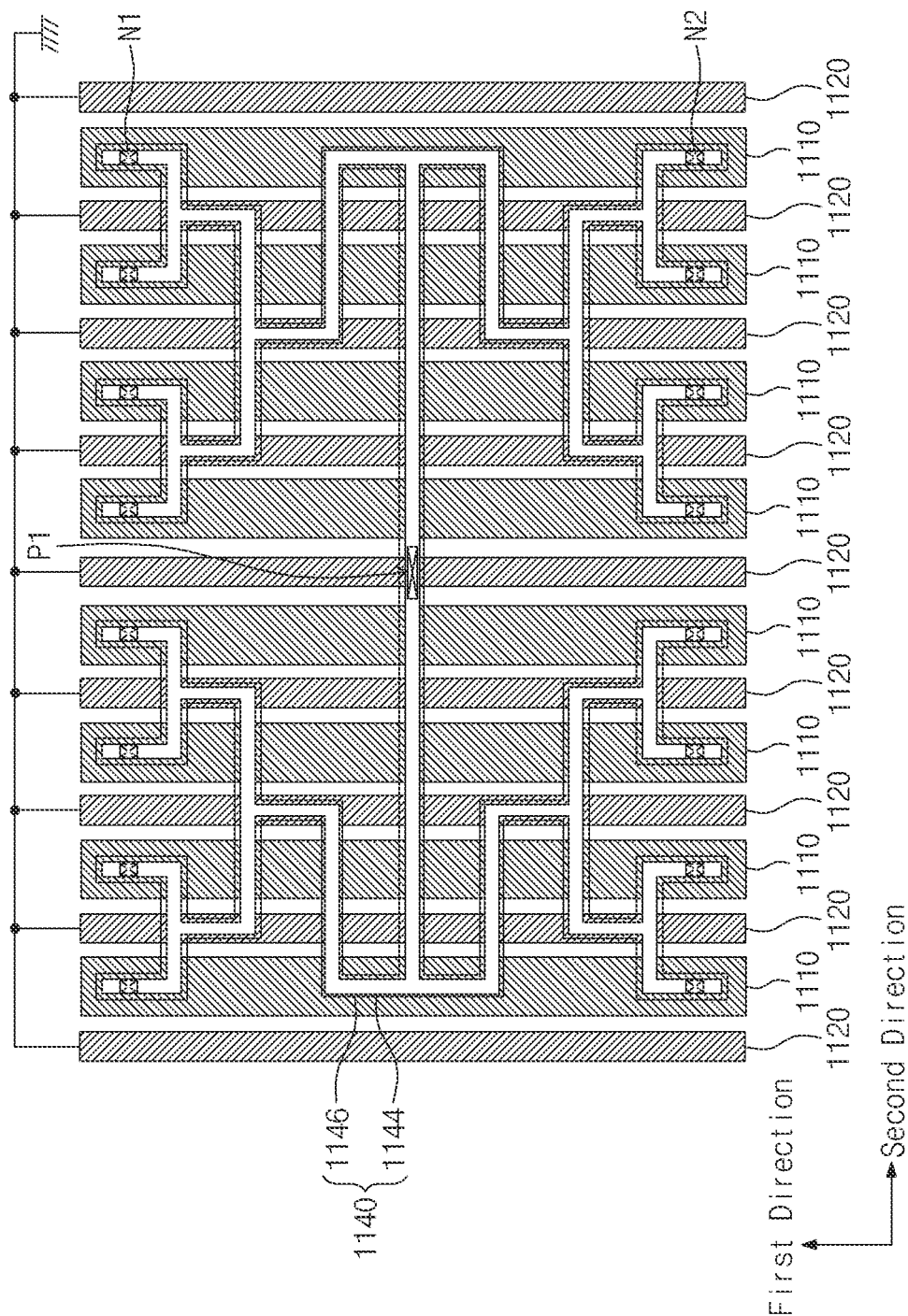
FIG. 8 is a top plan view of a power distribution unit.

FIG. 8 is a top plan view of a power distribution unit.

Referring to FIGS. 6 to 8, the plasma generating apparatus includes a vacuum container 1102 including a top plate 1104, a gas distribution unit 1130 disposed below the top plate 1104, insulating supporters 1150 disposed below the gas distribution unit 1130 and including a plurality of nozzles 1152 to output a process gas received from the gas distribution unit 1130 and extending parallel to each other in a first direction, ground electrodes 1120 disposed between the insulating supporters 1150 and extending parallel to each other in the first direction, and power electrodes disposed below the insulating supporter 1150 and extending parallel to each other in the first direction. An RF power is applied to the power electrodes 1110.

The vacuum container 1102 may have a pressure of atmospheric pressure or less. The vacuum container 1102 may have a shape of rectangular parallelepiped. The vacuum container 1102 may include a top plate 1104.

A gas inlet (not shown) and a gas outlet (not shown) may be disposed at the vacuum container 1102. The inlet allows a process gas to be supplied to the vacuum container 1102. The gas outlet allows a process gas and reactive byproducts of the vacuum container 1102 to be exhausted to the outside. The plasma generating apparatus 1100 may form amorphous or polycrystalline silicon on the substrate 1182. A pressure of the vacuum container 1102 may be hundreds of milliTorr (mTorr) to several Torr.

The substrate 1182 may be disposed on a substrate holder 1180. The substrate holder 1180 may be disposed to face the top plate 1104. The substrate 1182 may be disposed parallel to the top plate 1104. The substrate 1182 may be a semiconductor substrate, a glass substrate or a dielectric substrate. The substrate 1182 may be a quadrangular substrate. A material deposited on the substrate 1182 may be amorphous or polycrystalline silicon. The substrate holder 1180 may include a heating unit (not shown). The heating unit may heat the substrate 1182. A temperature of the substrate 1182 may be a room temperature to 300 degrees centigrade. The substrate 1182 or the substrate holder 1180 may be electrically floated. A gap "g" between the substrate 1182 and the power electrode 1110 may be several centimeters (cm) to tens of centimeters (cm).

The top plate 1104 may be disposed on a top surface of the vacuum container 1102. The top plate 1104 may be a metal. The top plate 1104 may be aluminum or stainless steel. The top plate 1104 may have a shape of square plate. The top plate 1104 and the vacuum container 1102 may closely contact each other to be maintained at vacuum. The top plate 1104 may include a plurality of through-holes 1106. A power supply line 1142 is disposed at the through-hole 1106. The power supply line 1142 electrically connects a power distribution unit 1140 with the power electrode 1110. The power supply line 1142 may support the power electrode 1110. The through-hole 1106 may be aligned in a second direction intersecting the first direction. An auxiliary through-hole (not shown) may be spaced apart from the through-hole 1106 in the first direction to be disposed both edge regions.

The gas distribution unit 1130 may receive a process gas from the gas inlet. The gas distribution unit 1130 may be disposed below the top plate 1104. The gas distribution unit 1130 may include an upper gas distribution plate 1130a and a lower gas distribution plate 1130b disposed below the upper gas distribution plate 1130a.

The lower gas distribution plate 1130b may include a first trench 1133 extending in a first direction on a top surface of the lower gas distribution plate 1130b and aligned with the nozzles 1152 disposed in the first direction and preliminary nozzles 1135 disposed within the first trench 1133 and aligned with the nozzles 1152. The preliminary nozzles 1135 may have regular intervals and may be arranged in the first direction.

The lower gas distribution plate 1130b may have a first trench 1133 in a region in which the preliminary nozzles 1135 are disposed. The preliminary nozzles 1135 may be disposed within the trench 1133. The preliminary nozzles 1135 aligned in the first direction and the preliminary nozzles 1135 spaced apart from each other in the second direction may be disposed within the first trench 1133. Thus, the first trench 1133 may supply a process gas to a pair of preliminary nozzles 1135.

The first trench 1133 may extend in a second direction intersecting the first direction to connect the pair of the nozzles 1152 adjacent to each other on the basis of the ground electrode 1120.

The lower gas distribution plate 1130b may include lower through-holes 1137b. The upper gas distribution plate 1130a may include upper through-holes 1137a aligned with the lower through-holes 1137b. The lower through-holes 1137b may be a pair of through-holes formed at the lower gas distribution plate 1130b. The upper through-holes 1137a may be a pair of through-holes formed at the upper gas distribution plate 1130a. The lower through-holes 1137b and the upper through-holes 1137a may be aligned with the through-holes 1106 formed at the top plate 1104.

An auxiliary through-hole 1137c may be formed to be spaced apart from the lower through-hole 1137b and the upper through-hole 1137a in the first direction. The auxiliary through-hole 1137c may penetrate the gas distribution unit 1130. The auxiliary through-hole 167c may be aligned with an auxiliary through-hole formed at the top plate 1104.

The lower gas distribution plate 1130b may further include through-holes 1138 for ground electrode connection disposed in the center of the trench 1133. The through-hole 1138 for ground electrode connection may be disposed on the ground electrode 1120. The ground electrode 1120 may include holes 1127 aligned with the through-holes 1138 for ground electrode connection.

Connection means may fixedly connect the lower distribution plate 1130b and the ground electrode 1120 to a hole 1127 formed on the top surface of the ground electrode 1120 through the through-hole 1138 for ground electrode connection. The connection means may be a bolt.

The upper gas distribution plate 1130a may include a second trench 1139 extend to the top surface of the upper gas distribution plate 1130a in the second direction intersecting the first direction and a gas supply through-hole 1136 formed within the second trench 1139 and aligned with the first trench 1133.

A gas inlet (not shown) may be disposed on the top plate 1104. A process gas flows into the second trenches 1139 along a through-hole (not shown) formed at the top plate 1104. The second trench 1139 may be provided in plurality, and the plurality of second trenches 1139 may extend parallel to each other in the second direction. The second trenches 1139 may be connected through an auxiliary trench (not shown) extending in the first direction. The auxiliary trenches may be formed at the edge of the upper gas distribution plate 1130b.

A plurality of gas supply through-holes 1136 may be formed within the second trench 1139. The gas supply through-holes 1136 may be disposed at regular intervals in the second direction. Thus, the process gas is supplied to the first trench 1133 through the gas supply through-holes 1136. The process gas supplied to the first trench 1133 is supplied to the nozzles 1152 through the preliminary through-holes 1135.

The upper gas distribution plate 1130a and the lower gas distribution plate 1130b may be connected through connection means. The connection means may be a bolt. Thus, the process gas is supplied through the gas inlet, the second trench 1133, the gas supply through-hole 1136, the first trench 1133, the preliminary nozzles 1135, and the nozzles 1132.

The gas distribution unit 1130 may supply a uniform process gas to the nozzles 1152 using the first trench 1133 formed in the first direction and the second trench 1139 formed in the second direction without passing through the power supply line 1142 and a fixed line 1143.

The gas distribution unit 1130 may be made of a conductor. The gas distribution unit 1130 may be grounded.

An insulating supporter 1150 is disposed below the gas distribution unit 1130. The insulating supporter 1150 may include at least one of alumina, ceramic, quartz, Teflon, and silicon. The insulating supporter 1150 may have a multi-layer structure.

The insulating supporter 1150 may include an upper insulating supporter 1150a and a lower insulating supporter 1150l disposed below the upper insulating supporter 1150a. The upper insulating supporter 1150a and the lower insulating supporter 1150b may be aligned with each other. The nozzle 1152 may include an upper nozzle 1152a penetrating the upper insulating supporter 1150a and a lower nozzle 1152b penetrating the lower insulating supporter 1150b.

A diameter of the upper nozzle 1152a may be greater than that of the lower nozzle 1152b. The upper insulating supporter 1150a may be made of Teflon, a PEEK resin, ceramic, MICA, or plastic. On the other hand, the lower insulating supporter 1150b may be made of ceramic or alumina. When discharge occurs between the power electrode 1110 and the lower electrode 1120, the lower nozzle 1152b and the upper nozzle 1152a may be misaligned due to difference in coefficients of thermal expansion. Accordingly, the diameter of the upper nozzle 1152b is preferably greater than that of the lower nozzle 1152a to prevent the misalignment.

The insulating supporter 1150 may be disposed parallel to the top plate 1104. The nozzles 1132 may supply a process gas between the power electrode 1110 and the ground electrode 1120. The nozzles 1132 may be arranged at regular intervals in the first direction in which the power electrode 1110 extends.

The insulating supporter 1150 may include a through-hole 1151. The through-hole 1151 may be disposed in the center of the insulating supporter 1150. The through-hole 1151 may include an upper through-hole 1151a formed at the upper insulating supporter 1150a and a lower through-hole 1151b formed at the lower insulating supporter 1150b. The upper through-hole 1151a may be aligned with the lower through-hole 1151b. The power supply line 1142 may be connected to the power electrode 1110 through the upper through-hole 1137a, the lower through-hole 1137b, and the through-hole 1151. Thus, RF power is supplied to the power electrode 1110 through the plurality of power supply lines 1142. As a result, the standing wave effect may be reduced.

An auxiliary through-hole of the insulating supporter 1150 may be disposed to be spaced apart from the through-hole 1151 in the first direction. The auxiliary through-hole 1153 may penetrate the insulating supporter 1150. The auxiliary through-hole 1153 may be aligned with the auxiliary through-hole 1137c of the gas distribution unit 1130. The auxiliary through-hole 1153 may the same shape as the through-hole 1151. The fixed line 1143 is connected to the power electrode 1110 through the auxiliary through-holes 1153 and 1137c. Thus, a plurality of fixed lines 1142 are insulated from the top plate 1104 and fixedly connected to the top plate 1104. As a result, the power electrode 1110, the insulating supporter 1150, and the gas distribution unit 1130 are fixed to the top plate 1104. The fixed line 1143 has a similar structure to the power supply line 1142. However, the fixed line 1143 is not connected to the RF power source.

The ground electrode 1120 may be disposed between the insulating supporters 1150 to extend in the first direction. The insulating supporter 1150 may have a shape of band extending in the first direction. The nozzles 1132 may be disposed at both edges of the insulating supporter 1150 adjacent to the ground electrode 1120. Thus, the nozzles 1152 may supply a process gas between the ground electrode 1120 and the power electrode 1110. The process gas may include hydrogen gas ($H_2$) and silane ($SiH_4$).

The ground electrodes 1120 may extend parallel to each other in the first direction. A distance between the ground electrodes 1120 may be constant. The ground electrode 1120 may have a shape of prism or truncated triangular prism. As long as a distance "d" between the ground electrode 1120 and the power electrode 1110 may include a constant region 1103, the shape of the ground electrode 1120 and the shape of the power electrode 110 may be variously changed. The exposed ground electrodes may form a rounded surface.

The ground electrodes 1120 may be arranged in the second direction intersecting the first direction. A plane defined by the first direction and the second direction may be parallel to the plane on which the top plate 1104 is disposed. A top surface of the ground electrodes 1120 may be identical to that of the insulating supporter 1150.

The ground electrode 1120 may be divided into an exposed ground electrode 1120b exposed to the inside of the vacuum container 1102 and a buried ground electrode 1120a buried in the insulating supporter 1150. The buried ground electrode 1120a may be inserted into the insulating supporter 1150.

Width of one end of the exposed ground electrode 1120b is t3, and width of the other end thereof is t4. The width t4 is greater than the width t3. The other end of the exposed ground electrode 1120b may face the substrate 1182. Thus, the exposed ground electrode 1120b may be tapered. The other end of the exposed ground electrode 1120b may have a rounded shape. A third direction is perpendicular to the plane defined by the first direction and the second direction. An angle θ between the third direction and one surface of the exposed ground electrode 1120b may be 5 degrees to 15 degrees.

The power electrode 1110 may be attached to the insulating supporter 1150. A top surface of the power electrode 1110 may match a bottom surface of the insulating supporter 1150. The power electrode 110 may extend in a lengthwise direction of the ground electrode 1120. The power electrode 1110 may be a conductive material. The power electrodes 1110 may extend parallel to each other in the first direction. The power electrodes 1110 may be arranged to be spaced apart from each other in the second direction. The number of the power electrodes 1110 may be even. A plurality of holes may be formed on a surface of a power electrode 1110 that is in contact with the insulating supporter 1150. The power supply line 1142 may be fixedly connected to the hole of the power electrode 1110.

On a surface that is in contact with the insulating supporter 1150, width of one end of the power electrode 1110 is t1 and width of the other end thereof is t2. The width t2 is smaller than the width t1. A distance "d" between the power electrode 1110 and the ground electrode 1120 may be constant. The distance "d" between the power electrode 1110 and the ground electrode 1120 may be 3 mm to 10 mm. When the distance "d" is less than 3 mm, it may be difficult to perform discharge. In addition, when the distance "d" exceeds 10 mm, process uniformity by discharge may be degraded. The other end of the power electrode 1110 may have a rounded shape. Height h1 of the exposed power electrode may be greater than or equal to height h2 of the exposed ground electrode.

The power electrodes 1110 may include one or more holes 1112 on a surface facing the ground electrode 1120. The holes 1112 may be regularly arranged. The holes 1112 may induce hollow cathode discharge. The holes 1112 may be aligned in the first direction.

In capacitively coupled plasma, plasma density may increase when a frequency of the RF power source 1170 increases. However, standing wave effect may increase when the frequency of the RF power source 1170 increases. The standing wave effect may restrict plasma uniformity and process uniformity. Supplying RF power to nodes N1 and N2 of the power electrode 1110 may reduce the standing wave effect. A plasma density distribution may vary depending on a position where the RF power is supplied to the power electrode 1110.

The power electrodes 1110 may be equally divided into N parts. The RF power is supplied to the center of the N parts of the power electrode 1110. That is, the nodes N1 and N2 of the power electrode 1110 may be disposed in the center of the N parts. A current distribution and/or a voltage distribution of the power electrode 1110 may be symmetrical to the center of the power electrode 1110.

For example, the power electrodes 1110 may include nodes N1 and N2. The nodes N1 and N2 may supply power of the RF power source to the power electrode 1110. The nodes N1 and 2 include a first node N1 and a second node N2. Length of the power electrode 1140 is L. The first node N1 may be disposed at a position of L/4, and the second node N2 may be disposed at a position of 3L/4. Current may have a maximum value at the nodes N1 and N2, and a voltage may have a minimum value at the nodes N1 and N2. A distribution of the current or the voltage may be horizontally symmetrical to the nodes N1 and N2. Phases of voltages at the nodes N1 and N2 may be in-phase.

Positions of the nodes N1 and N2 may be changed to have process uniformity of the first direction.

Plasma may be generated between the power electrode 1110 and the ground electrode 1120. A distance "d" between the power electrode 110 and the ground electrode 120 may be 3 mm to 15 mm. A structure where the power electrode 1110 and the ground electrode 1120 are adjacent to each other may enhance stability of plasma. In addition, the structure may reduce a potential of the plasma and/or a DC bias. The substrate may be floated to allow the plasma generating apparatus to provide a low lattice defect during a deposition process.

A tapered power electrode 1110 and a tapered ground electrode 1120 may improve a flow pattern of process gas. With t1 of one end of the power electrode 1110 is greater than width t2 of the other end of the power electrode 1110. Thus, the power supply line 1142 may be easily coupled with the power electrode 110. Moreover, a process speed may be improved by increasing a discharge area.

A curvature-type power electrode 1110 and a curvature-type ground electrode 1120 may improve a flow pattern of process gas. The curvature-type power electrode 110 and the curvature-type ground electrode 120 may suppress are discharge.

The height h1 of the power electrode 110 may be greater than the height h2 of the ground electrode 120. Thus, process uniformity and process speed may be ensured at a pressure of 5 Torr or less.

Preferably, width t2 of the other end of the power electrode 1110 may be about 10 mm. Preferably, width of the other end of the exposed ground electrode 1120b may be about 10 mm. Preferably, a distance "d" between the power electrode 1110 and the ground electrode 1120 may be 3 mm to 15 mm. The substrate 1182 may be minimally exposed to plasma. That is, the plasma generating apparatus may generate remote plasma and a radical may be supplied to the substrate 1182.

The power distribution unit 1140 may be means for receiving power of the RF power source 1170 from a power terminal P1 and transferring the power to the power electrodes 1110. The power distribution unit 1140 may include a power distribution line 1144 and a guide unit 1146 disposed around the power distribution unit 1144. The guide unit 1146 is grounded. Thus, the power distribution line 1144 and the guide unit 1146 may form a transmission line. The power distribution unit 1140 may be disposed outside the vacuum container 1102.

According to a modified embodiment of the present invention, the power distribution unit 1140 may be disposed inside the vacuum container 1102. The power distribution unit 1140 may be disposed between the top plate and the gas distribution unit.

The power supply line 1142 electrically connects the power distribution line 1144 to the power electrode 1110. The power supply line 1142 may support the power electrode 1110. A plurality of power supply lines 1142 may be connected to one power electrode 1110. Thus, the power electrode 1110 may receive power in-phase at a plurality of positions.

The RF power source 1170 supplies power to the power distribution line 1144 through an impedance matching network 1150. A distance between the power supply lines 1142 and a power supply point of the RF power source 1170 is constant. Thus, the power supply line 1142 may supply power in-phase to all the power electrodes 1110. A frequency of the RF power source 1170 may be 1 MHz or more. Preferably, the frequency of the RF power source 1170 may be 13.56 MHz to 50 MHz. The impedance matching network 1160 may be means for maximally transferring the power of the RF power source 1170 to a load.

When a power electrode is perpendicularly disposed, a deposition rate at a substrate disposed below the power electrode may vary depending on position. An inclined structure of an electrode overcomes deposition non-uniformity. That is, discharge occurs between a power electrode and a ground electrode, and a radical generated at each discharge area is uniformly transferred to the substrate to improve uniformity due to inclination of the discharge area.

An insulating supporter of a double-layered structure is disposed to achieve insulation between a power electrode and a ground electrode. A nozzle of the insulating supporter supplies a process gas, and nozzle clogging caused by thermal expansion is prevented.

In order to effectively discharge plasma, capacitance established between a ground electrode and a power electrode must be high. In order to meet this condition, it is advantageous to maximally extend the range of an insulator in a process gas injection area vertically over the power electrode and the ground electrode. After extending the insulating maximally close to the edge of the ground electrode, a direct nozzle is disposed at the insulator.

Figure 9:
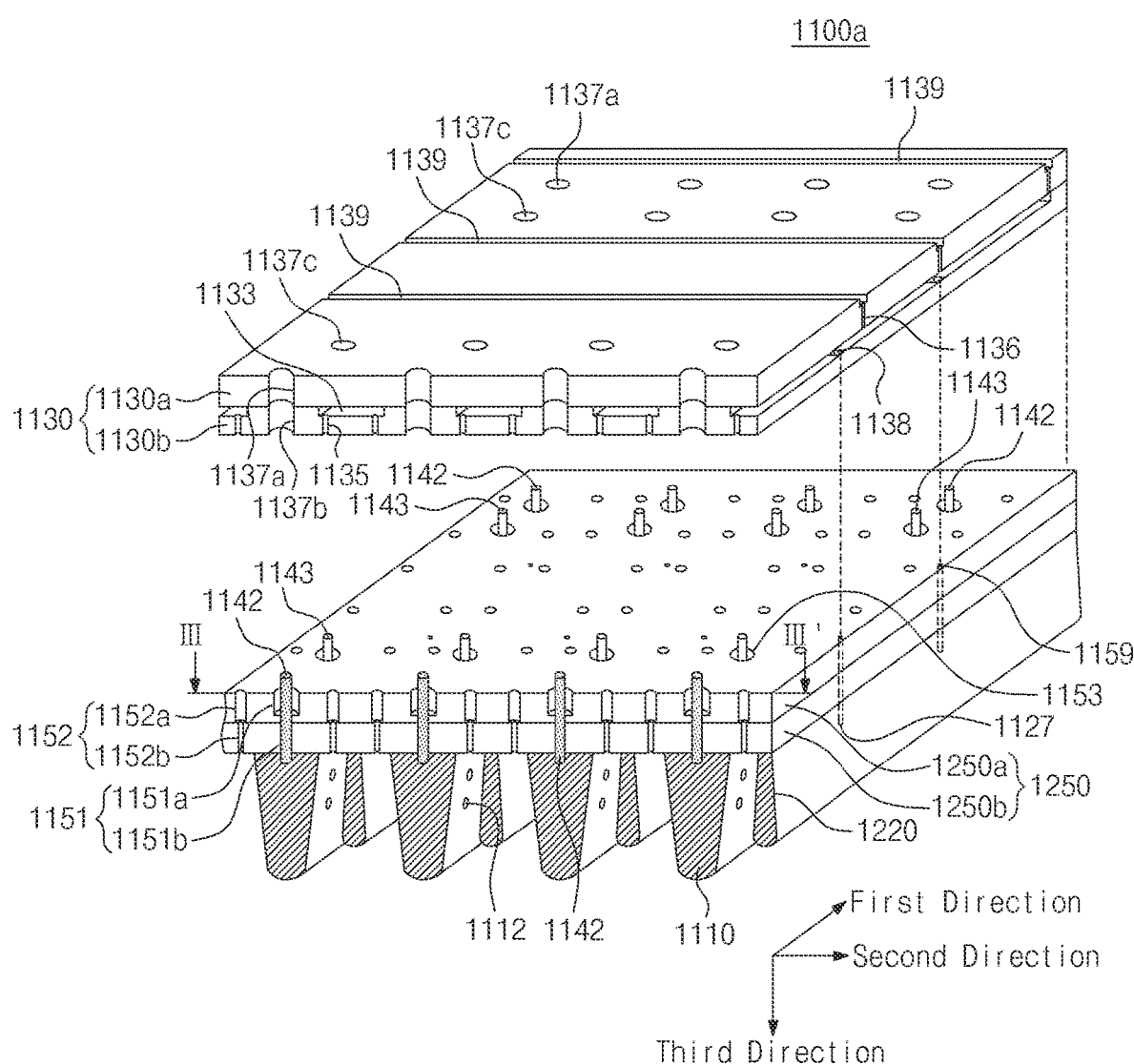
FIG. 9 is a partial perspective view of a plasma generating apparatus according to another embodiment of the present invention.

FIG. 9 is a partial perspective view of a plasma generating apparatus 100a according to another embodiment of the present invention.

Figure 10:
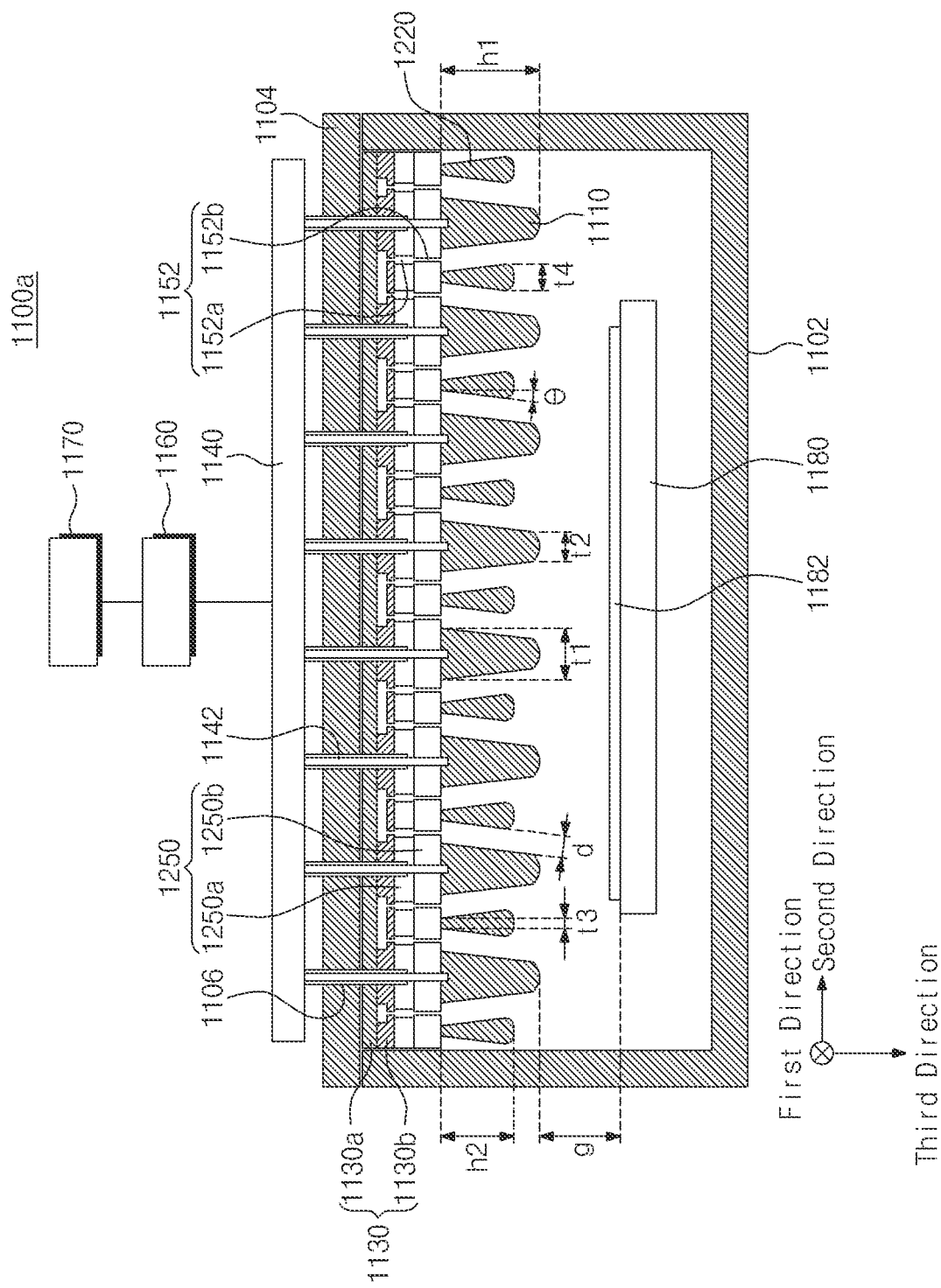
FIG. 10 is a cross-sectional view taken along the line III-III' in FIG. 9.

FIG. 10 is a cross-sectional view taken along the line III-III' in FIG. 9.

In FIGS. 9 and 10, sections different from FIGS. 6 to 8 will be extensively explained to avoid duplicate explanation.

Referring to FIGS. 9 and 10, the plasma generating apparatus 1100a includes a vacuum container 1102 including a top plate 1104, a gas distribution unit 1130 disposed below the top plate 1102, an insulating supporter 1250 disposed below the gas distribution unit 1130 and including a plurality of nozzles 1152 to output a process gas received from the gas distribution unit 1130, ground electrodes 1220 disposed below the insulating supporter 1250 and extending parallel to each other in a first direction, and power electrodes 1110 disposed below the insulating supporter 1250 and extending parallel to each other in the first direction. RF power is applied to the power electrodes 1110.

A top surface of the power electrode 1110 may match a bottom surface of the insulating supporter 1250. The insulating supporter 1250 may include an upper insulating support plate and a lower insulating support plate disposed below the upper insulating support plate.

The insulating supporter 1250 may include a through-hole for fixing the ground electrode 1220. The through-hole 1159 may be aligned with a through-hole 1138 formed at the gas distribution unit 1130 and a hole 1127 formed on a top surface of the ground electrode 1220. The insulating supporter 1250 may not be separated from each other, i.e., may be integrated in a body.

The power electrode 1110 has first height h1 from a first surface contacting the insulating supporter 1250 in a third direction orthogonal to the first direction and the second direction. The power electrode 1110 has first thickness t1 on the first surface. The power electrode 1110 has second thickness t2 at one end spaced in the third direction on the first surface.

The ground electrode 1220 has second height h2 from the first surface contacting the insulating supporter 1250. The ground electrode 1220 has third thickness t3 on the first surface contacting the insulating supporter 1250. The ground electrode 1220 has fourth thickness t4 at one end spaced in the third direction on the first surface. The first thickness t1 is greater than the second thickness t2, and the third thickness t3 is smaller than the fourth thickness t4. A vertical distance between the ground electrode 1220 and the power electrode 1110 is constant.

The first height h1 may be greater than or equal to the second height h2. One end of the ground electrodes 1220 and one end of the power electrode 1110 may be rounded. An angle between an exposed side surface of the power electrode 1110 and the third direction may be 5 degrees to 15 degrees. Alternatively, an angle between an exposed side surface of the ground electrode 1220 and the third direction may be 5 degrees to 15 degrees.

The power electrode 1110 may have a shape of truncated triangular prism. The ground electrode 1220 may have a shape of truncated triangular prism. The ground electrode 1220 may be upside-down coupled to the dielectric supporter 1250 such that a distance "d" between the power electrode 110 and the ground electrode 1220 is constant.

The dielectric supporter 1250 may include a plurality of nozzles 1152 arranged in a first direction. The nozzles 1152 may supply a process gas between the power electrode 1110 and the ground electrode 1220. The dielectric supporters 1250 may not be separated from each other, i.e., may be integrated in a body. The ground electrode 1220 and the power electrode 1110 may be disposed in contact with a bottom surface of the dielectric supporter 1250.

According to a modified embodiment of the present invention, a portion of the power electrode 1110 and a portion of the ground electrode 1220 may be inserted into the dielectric supporter 1250.

Figure 11:
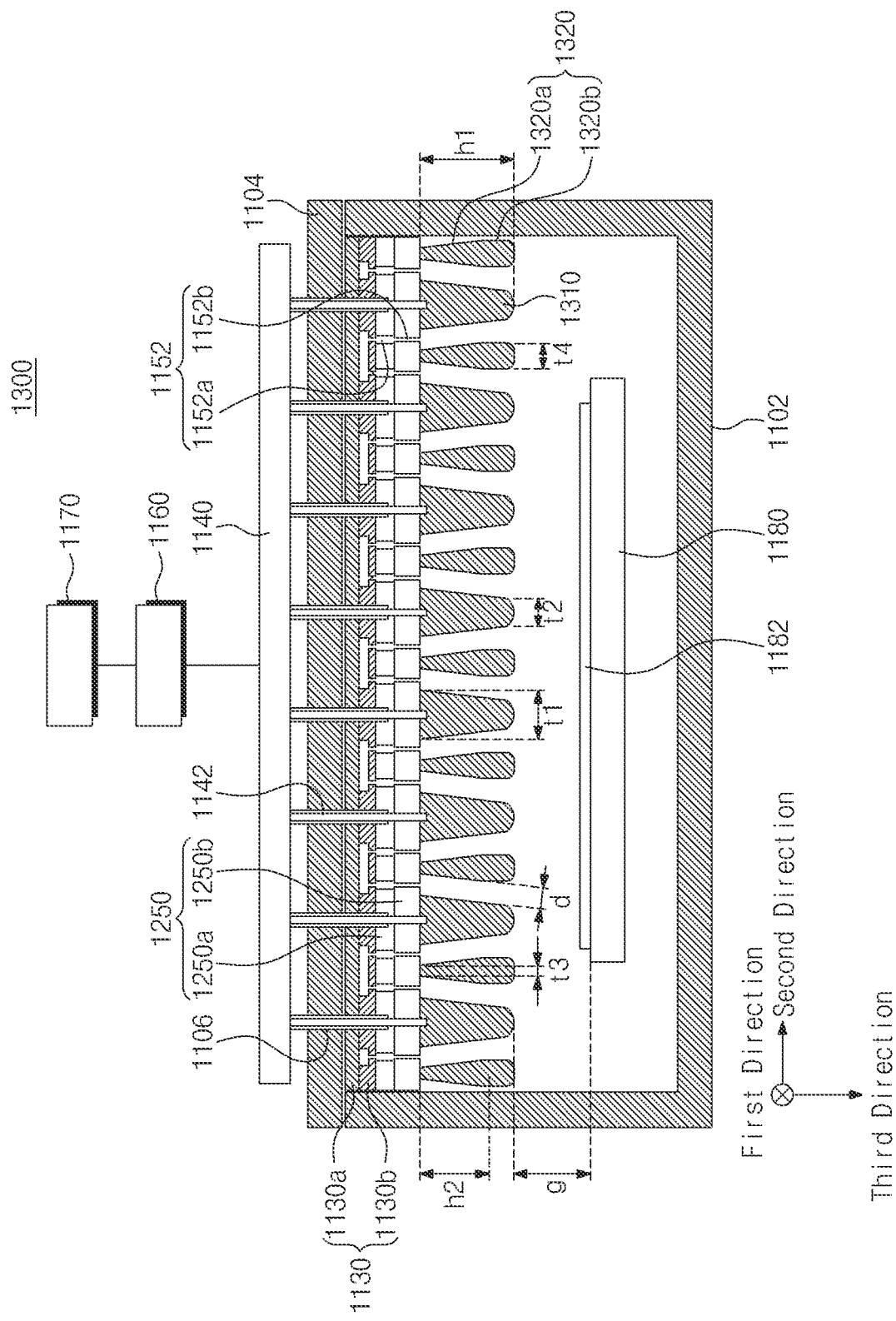
FIG. 11 illustrates a substrate processing apparatus according to another embodiment of the present invention.

FIG. 11 illustrates a substrate processing apparatus 1300 according to another embodiment of the present invention. In FIG. 11, sections different from FIGS. 6 to 10 will be extensively explained to avoid duplicate explanation.

Referring to FIG. 11, the substrate processing apparatus 1300 includes a plurality of ground electrodes 1320 disposed inside a vacuum container 1102 and extending parallel to each other, power electrodes 1310 disposed inside the vacuum container 1102 and disposed between the ground electrodes 1320, and a substrate holder 1180 disposed to face the ground electrodes 1320 and the power electrodes 1310 and holding a substrate 1182.

A distance "d" between the ground electrode 1320 and the power electrode 1310 includes a constant area. The power electrode 1310 is tapered in a direction facing the substrate 1182. The power electrodes 1310 are connected to an RF power source 1170.

The ground electrode 1320 includes a taper portion 1320a whose width increases in a direction of the substrate 1182 and an extending portion 1320b having a constant width. The ground electrode 1320 and the power electrode 1310 may be disposed on a bottom surface of a dielectric supporter 1250.

[Third Structure]

When power electrodes and ground electrodes extend parallel to each other, a pattern of the power electrodes may be formed on a surface of a substrate. Thus, process uniformity may be reduced. Shapes of the power electrodes and the ground electrodes may have an effect on the process uniformity of the substrate. Further, increase in a distance between the power electrode and the substrate may increase process uniformity. However, the increase in a distance between the power electrode and the substrate may reduce process speed. Accordingly, there is a requirement for a novel structure of the power electrodes and the ground electrode to provide high process speed and high process uniformity. Therefore, a plasma generating apparatus according to an embodiment of the present invention proposes an inclined electrode structure. In addition, a distance between the power electrode and the ground electrode is short. Accordingly, there is a requirement for a novel gas distribution structure.

Figure 12:
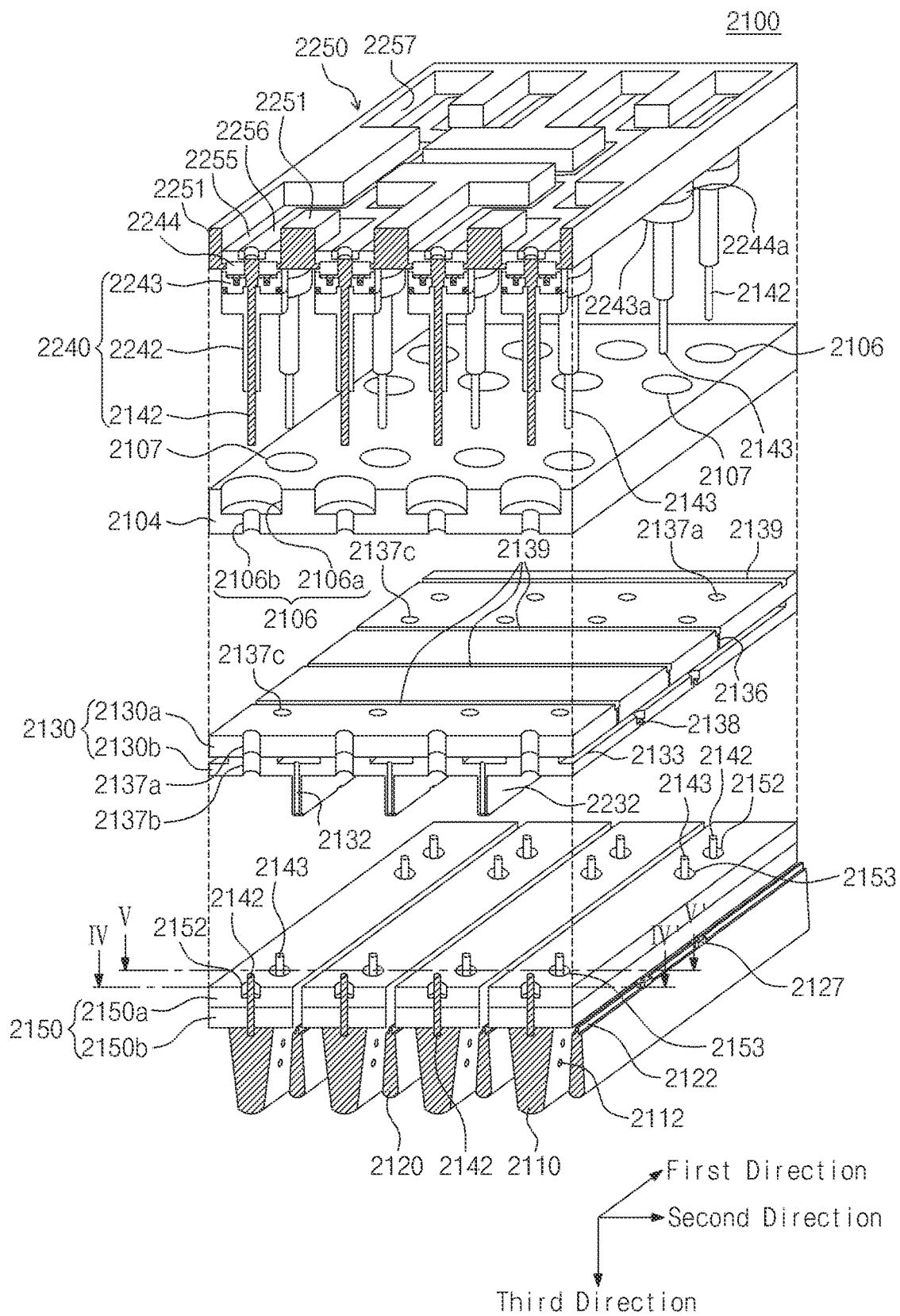
FIG. 12 is a partial perspective view of a plasma generating apparatus according to another embodiment of the present invention.

FIG. 12 is a partial perspective view of a plasma generating apparatus 2100 according to another embodiment of the present invention.

Figure 13:
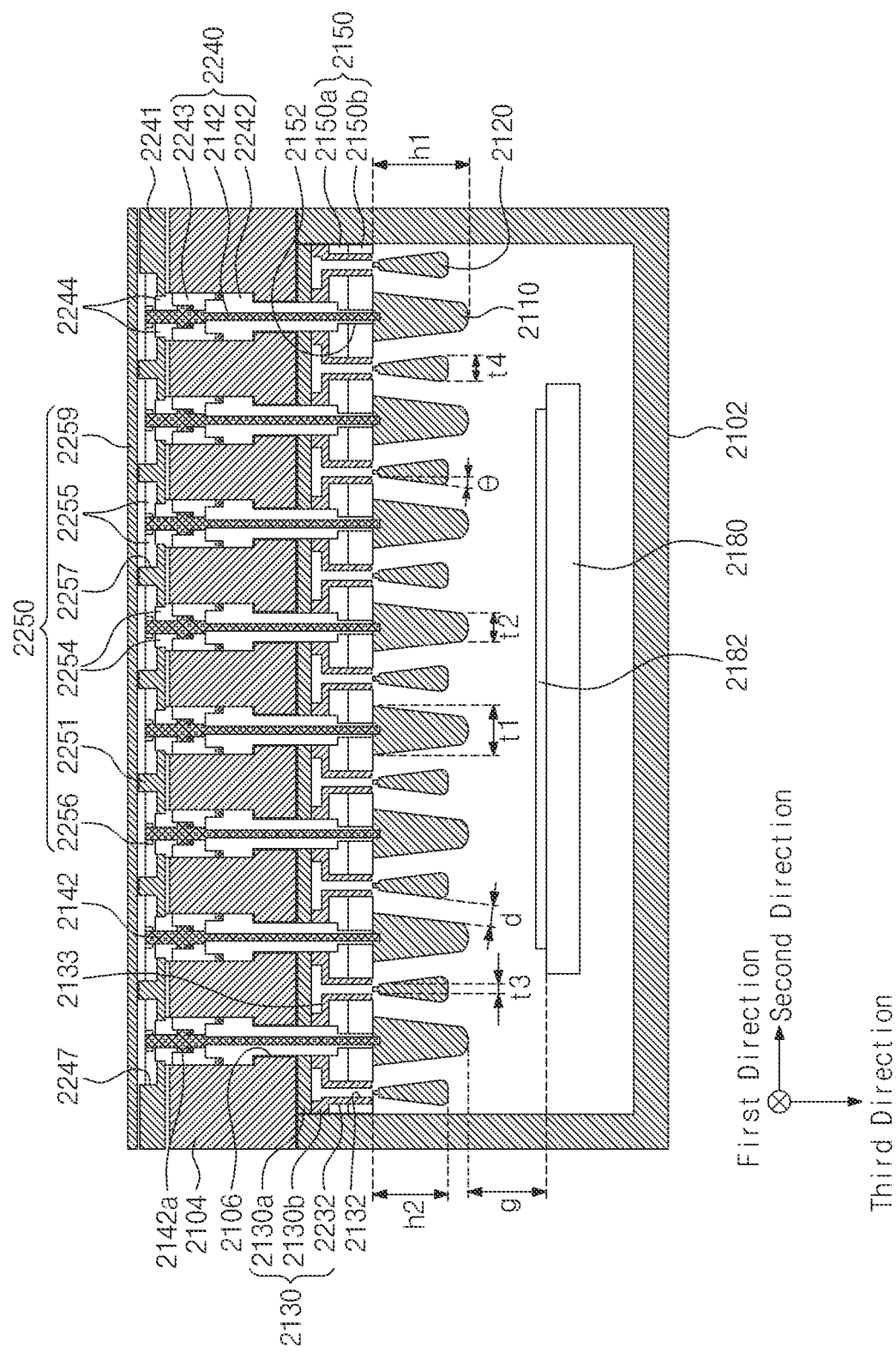
FIG. 13 is a cross-sectional view taken along the line IV-IV' in FIG. 12.

FIG. 13 is a cross-sectional view taken along the line IV-IV' in FIG. 12.

Figure 14:
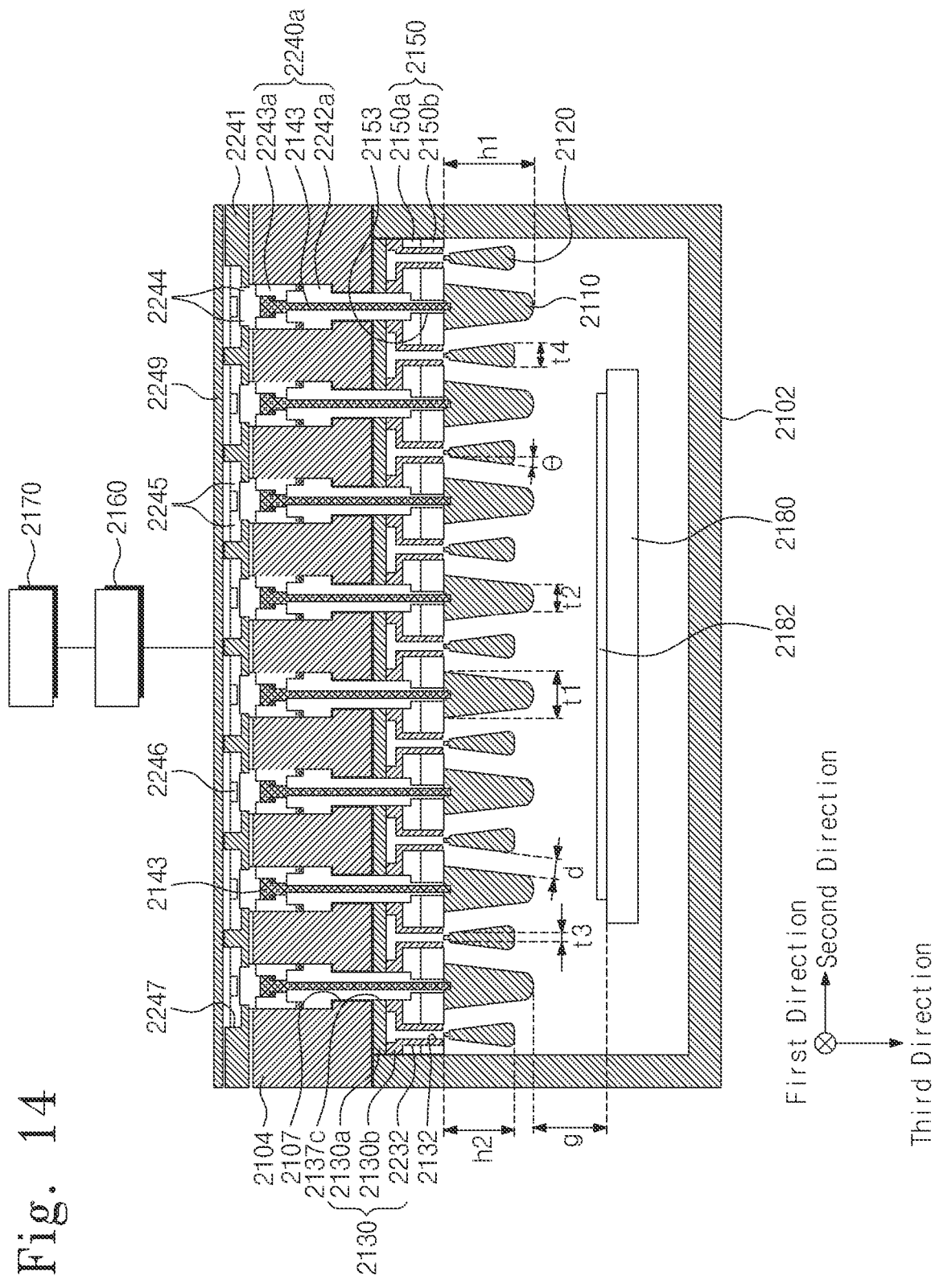
FIG. 14 is a cross-sectional view taken along the line V-V' in FIG. 12.

FIG. 14 is a cross-sectional view taken along the line V-V' in FIG. 12.

Figure 15:
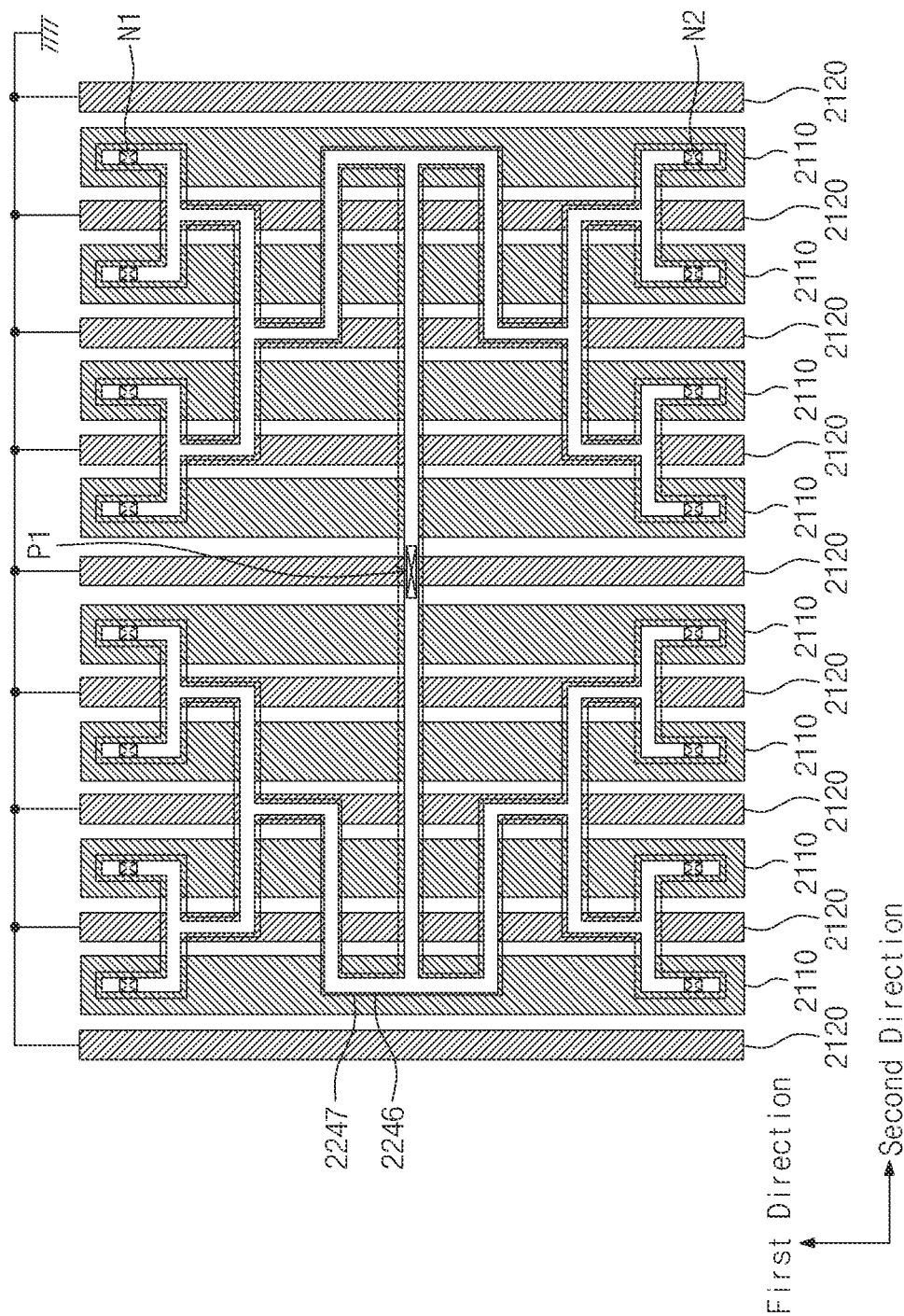
FIG. 15 is a top plan view of a power distribution unit.

FIG. 15 is a top plan view of a power distribution unit.

Referring to FIGS. 12 to 15, the plasma generating apparatus 2100 includes a vacuum container 2102 including a top plate 2104, a gas distribution unit 2130 disposed below the top plate 2104 and including a plurality of nozzles 2132 to output a process gas, insulating supporters 2150 disposed below the gas distribution unit 2130 and extending parallel to each other in a first direction, ground electrodes 2120 disposed below the gas distribution unit 2130 and extending parallel to each other in the first direction, power electrodes 2110 disposed below the insulating supporters 2150 and extending parallel to each other between the ground electrodes 2120 in the first direction, a power supply unit 2240 to supply RF power to the power electrodes 2120 through the gas distribution unit 2130 and the power supporter 2150.

The vacuum container 2102 may have a pressure of atmospheric pressure or less. The vacuum container 2102 may have a shape of rectangular parallelepiped. The vacuum container 2102 may include a top plate 2104.

A gas inlet (not shown) and a gas outlet (not shown) may be disposed at the vacuum container 2102. The inlet allows a process gas to be supplied to the vacuum container 2102. The gas outlet allows a process gas and reactive byproducts of the vacuum container 2102 to be exhausted to the outside. The plasma generating apparatus 2100 may form amorphous or polycrystalline silicon on the substrate 2182. A pressure of the vacuum container 2102 may be hundreds of milliTorr (mTorr) to several Torr.

The substrate 2182 may be disposed on a substrate holder 2180. The substrate holder 2180 may be disposed to face the top plate 2104. The substrate 2182 may be disposed parallel to the top plate 2104. The substrate 2182 may be a semiconductor substrate, a glass substrate or a dielectric substrate. The substrate 1182 may be a quadrangular substrate. A material deposited on the substrate 2182 may be amorphous or polycrystalline silicon. The substrate holder 2180 may include a heating unit (not shown). The heating unit may heat the substrate 2182. A temperature of the substrate 2182 may be a room temperature or 300 degrees centigrade. The substrate 2182 or the substrate holder 2180 may be electrically floated. A gap "g" between the substrate 2182 and the power electrode 2110 may be several centimeters (cm) to tens of centimeters (cm).

The top plate 2104 may be disposed on a top surface of the vacuum container 2102. The top plate 2104 may be a metal. The top plate 2104 may be aluminum or stainless steel. The top plate 2104 may have a shape of square plate. The top plate 2104 and the vacuum container 2102 may closely contact each other to be maintained at vacuum. The top plate 2104 may include a plurality of through-holes 2106. A power supply line 2142 is disposed at the through-hole 2106. The power supply line 2142 electrically connects a power distribution unit 2250 with the power electrode 2110. The power supply line 2142 may support the power electrode 2110. The through-hole 2106 may be aligned in a second direction intersecting a first direction. The through-hole 2106 may be formed on both ends of the power electrode 2110. The through-hole 2106 may include a first hole 2106a having a relatively greater diameter and a second hole 2106b aligned with the first hole 2106a and having a relatively smaller diameter.

In addition, an auxiliary through-hole 2107 may be disposed in both edge regions of the substrate 2104 to be spaced apart from the through-hole 2106 in the first direction. The auxiliary through-hole 2107 may have the same shape as the through-hole 2106.

The gas distribution unit 2130 may receive a process gas from the gas inlet. The gas distribution unit 2130 may be disposed below the top plate 2104. The gas distribution unit 2130 may include an upper gas distribution plate 2130a and a lower gas distribution plate 2130b disposed below the upper gas distribution plate 2130a.

The lower gas distribution plate 2130b may include a first trench 2133 extending in a first direction on a top surface of the lower gas distribution plate 2130b and aligned with the nozzles 2132 disposed in the first direction. The nozzles 2132 may be arranged at regular intervals and aligned in the first direction.

The gas distribution unit 2130 may include spacers 2232 disposed at regular intervals and extending in the first direction. The spacers 2232 may extend in a perpendicular direction (substrate direction) below the lower gas distribution plate 2130b. The spacer 2232 is disposed between the insulating supporters 2150. The nozzles 2132 are disposed through the spacer 2232. Thickness of the insulating supporters 2150 may be equal to height of the spacer 2232. One end of the nozzles 2132 may be connected to the first trench 2133, and the other end of the nozzles 2132 may split in the form of "T". The nozzles 2132 disposed at the spacer 2230 may overcome a problem caused by thermal expansion or misalignment.

If the insulating supporter 2150 includes a nozzle, the cost of processing ceramic for forming the nozzle increases. However, the nozzle formed at the spacer 2230 may significantly reduce the processing cost.

The lower gas distribution pipe 2130b may include lower through-holes 2137b. The upper gas distribution pipe 2130a may include upper through-holes 2137a aligned with the lower through-holes 2137b. The lower through-holes 2137b may be a pair of through-holes formed at each lower gas distribution plate 2130b. The upper through-holes 2137a may be a pair of through-holes formed at each upper gas distribution plate 2130a. The lower through-holes 2137b and the upper through-holes 2137a may be aligned with the through-holes 2106 formed at the top plate 2104.

An auxiliary through-hole 2137c may be formed to be spaced apart from the lower through-hole 2137b and the upper through-hole 2137a in the first direction. The auxiliary through-hole 2137c may penetrate the gas distribution unit 2130. The auxiliary through-hole 2137c may be aligned with an auxiliary through-hole 2107 formed at the top plate 2104.

The lower gas distribution plate 2130b may further include through-holes 2138 for ground electrode connection disposed in the center of the trench 2133. The through-hole 2138 for ground electrode connection may be disposed on the ground electrode 2120. The ground electrode 2120 may include holes 2127 aligned with the through-holes 2138 for ground electrode connection.

Connection means (not shown) may fixedly connect the lower distribution plate 2130b and the ground electrode 2120 to a hole 2127 formed on the top surface of the ground electrode 2120 through the through-hole 2138 for ground electrode connection. The connection means may be a bolt.

The upper gas distribution plate 2130a may include a second trench 2139 extend to the top surface of the upper gas distribution plate 2130a in the second direction intersecting the first direction and a gas supply through-hole 2136 formed within the second trench 2139 and aligned with the first trench 2133.

A gas inlet (not shown) may be disposed on the top plate 2104. A process gas flows into the second trenches 2139 along a through-hole (not shown) formed at the top plate 2104. The second trench 2139 may be provided in plurality, and the plurality of second trenches 2139 may extend parallel to each other in the second direction. The second trenches 2139 may be connected through an auxiliary trench (not shown) extending in the first direction. The auxiliary trenches may be formed at the edge of the upper gas distribution plate 2130b.

A plurality of gas supply through-holes 2136 may be formed within the second trench 2139. The gas supply through-holes 2136 may be disposed at regular intervals in the second direction. Thus, the process gas is supplied to the first trench 2133 through the gas supply through-holes 2136. The process gas supplied to the first trench 2133 is supplied to the nozzles 2132.

The upper gas distribution plate 2130a and the lower gas distribution plate 2130b may be connected through connection means. The connection means may be a bolt. Thus, the process gas is supplied through the gas inlet, the second trench 2139, the gas supply through-hole 2136, the first trench 2133, and the nozzles 2132.

The gas distribution unit 2130 may supply a uniform process gas to the nozzles 2132 using the first trench 2133 formed in the first direction and the second trench 2139 formed in the second direction without passing through the power supply line 2142 and a fixed line 2143. The nozzles 2132 may supply a process gas onto the ground electrode 2120. The nozzles 2132 may be arranged at regular intervals in the first direction.

The gas distribution unit 2130 may be made of a conductor. The gas distribution unit 2130 may be grounded.

An insulating supporter 2150 is disposed below the gas distribution unit 2130. The insulating supporter 2150 may include at least one of alumina, ceramic, quartz, Teflon, and silicon. The insulating supporter 2150 may have a multi-layer structure. The insulating supporter 2150 is disposed between the spacers 2232. The insulating supporter 2150 may have a shape of line extending in the first direction.

The insulating supporter 2150 may include an upper insulating supporter 2150a and a lower insulating supporter 2150b disposed below the upper insulating supporter 2150a. The upper insulating supporter 2150a and the lower insulating supporter 2150b may be aligned with each other.

The upper insulating supporter 2150a may be made of Teflon, a PEEK resin, ceramic, MICA or plastic. On the other hand, the lower insulating supporter 1150b may be made of ceramic or alumina.

The insulating supporter 2150 may include a through-hole 2152. The through-hole 2152 may be disposed in the center of the insulating supporter 2150. The through-hole 2152 may include an upper through-hole formed at the upper insulating supporter 2150a and a lower through-hole formed at the lower insulating supporter 2150b. The upper through-hole may be aligned with the lower through-hole. The upper through-hole may have a dented part.

The power supply unit 2240 may include a power supply line 2142 connected to the power electrode 2110, a first insulating member 2242 surrounding the power supply line 2142 and hooked by the dented part of the through-hole 2106 formed at the top plate 2104, and a second connection member 2243 disposed on the first insulating member 2242 and inserted into the through-hole 2106 of the top plate 2104.

The power supply line 2142 is connected to the power electrode 2110 through the upper through-hole 2137a, the lower through-hole 2137b, and the through-hole 2152. Thus, RF power is supplied to the power electrode 2110 through a plurality of the power supply lines 2142. As a result, the standing wave effect may be reduced.

An auxiliary through-hole 2153 of the insulating supporter 2150 is disposed to be spaced apart from the through-hole 2152 in the first direction. The auxiliary through-hole 2153 may penetrate the insulating supporter 2150. The auxiliary through-hole 2153 may be aligned with the auxiliary through-hole 2137c of the gas distribution unit 2130. The auxiliary through-hole 2153 may have the same shape as the through-hole 2153. The fixed line 2143 is connected to the power electrode 2100 through the auxiliary through-holes 2153 and 2137c. Thus, a plurality of the fixed lines 2143 are insulated from the top plate 2104 and are fixedly connected to the top plate 2104. As a result, the power electrode 2110, the insulating supporter 2150, and the gas distribution unit 2130 are fixed to the top plate 2104. The fixed line 2143 may have a similar structure to the power supply line 2143. However, the fixed line 2143 is not connected to an RF power source.

One end of the first insulating member 2242 may be inserted into the through-hole 2152 of the insulating supporter 2150. The first insulating member 2242 may have a shape where cylinders of different diameters are connected. The power supply line 2142 is inserted into the first insulating member 2242. The first insulating member 2242 is disposed to be hooked by the through-hole 2106 of the top plate 2104. The first insulating member 2242 is hooked by a dented part of the through-hole 2106 of the top plate 2104.

The power supply line 2142 is inserted into the second insulating member 2243 and the second insulating member 2243 is disposed on the first insulating member 2242. A vacuum sealing portion may be disposed between the first insulating member 2242 and the second insulating member 2243. Thus, the vacuum sealing part may simultaneously seal an inner side surface of the through-hole 2106 of the top plate 2104 and the first and second insulating members 2242 and 2243.

The power supply line 2142 may include a washer portion 2142a to be inserted into the second insulating layer 2243 and hooked. A sealing member may be disposed between a bottom surface of the washer portion 2142a and a top surface of the second insulating member 2243. Thus, the power supply line 2142 may be sealed with the second insulating member 2243. As a result, the power supply unit 2240 may perform vacuum sealing and insulation.

The fixed supporter 2240a may include a fixed line 2143 connected to the power electrode 2110, a third insulating member 2242a surrounding the fixed line 2143 and hooked by the projection of the auxiliary through-hole 2107 formed at the top plate 2104, and a fourth insulating member 2243a disposed on the third insulating member 2242a and inserted into the through-hole 2107 of the top plate 2104. The fixed line 2143 may be inserted into the auxiliary through-holes 2107, 2137c, and 2153.

A shape of the fixed supporter 2240a is similar to that of the power supply unit 2240. However, the fixed supporter 2240a is not connected to an RF power source and fixes and supports the power electrode 2110 to the top plate 2104.

The ground electrode 2120 may be disposed below the spacer 2232 to extend in the first direction. A top surface of the ground electrode 2120 may include a protrusion 2122. The protrusion 2122 may extend in the first direction. Thus, a process gas supplied by the nozzles 2132 may be supplied to a discharge space between the power electrode 2110 and the ground electrode 2120 through both side surfaces of the protrusion 2122. The process gas may include hydrogen gas ($H_2$) and silane ($SiH_4$).

According to a modified embodiment of the present invention, the protrusion 2122 may not continue to extend in the first direction. Thus, an aperture may be formed on a top surface of the ground electrode 2120 to allow the process to flow only in an area where the nozzles 2132 and the ground electrode 2120 meet.

The ground electrodes 2120 may extend parallel to each other in the first direction. A distance between the ground electrodes 2120 may be constant. The ground electrode 2120 may have a shape of prism or truncated triangular prism. As long as an area where a distance "d" between the ground electrode 2120 and the power electrode 2110 is constant exists, the shape of the ground electrode 2120 and the shape of the power electrode 2110 may be variously changed. The exposed ground electrodes 2120 may form a curved surface, which may provides smooth flow of the process gas and suppresses pattern formation caused by the power electrode 2110 on the substrate 2104.

The ground electrodes 2120 may be arranged in a second direction intersecting the first direction. A plane defined by the first direction and the second direction may be parallel to a plane on which the top plate 2104 is disposed. The top surface of the ground electrodes 2120 and the top surface of the power electrodes 2110 may be identical to a bottom surface of the insulating supporter 2150.

Width of one end of the ground electrode 2120 is t3, and width of the other end of the ground electrode 2120 is t4. The width t4 is greater than the width t3. The other end of the ground electrode 2120 may face the substrate 2182. Thus, the ground electrode 2120 may be tapered. The other end of the ground electrode 2120 may be rounded. A third direction is perpendicular to a surface defined by the first direction and the second direction. An angle θ between the third direction and one side surface of the ground electrode 2120 may be 5 degrees to 15 degrees.

The power electrode 2110 may be attached to the dielectric supporter 2150. The top surface of the power electrode 2110 may match the bottom surface of the insulating supporter 2150. The power electrode 2110 extends in a lengthwise direction of the ground electrode 2120. The power electrode 2110 may be a conductive material. The power electrodes 2110 may extend parallel to each other in the first direction. The power electrodes 2110 may be arranged to be spaced apart from each other in the second direction. The number of the power electrodes 2110 may be even. A plurality of holes 2112 for hollow cathode discharge may be formed on a side surface of the power electrode 2110 contacting the insulating supporter 2150. The power supply line 2142 may be fixedly connected to the power electrode 2110.

On a surface that is in contact with the dielectric supporter 2150, width of one end of the power electrode 2110 is t1 and width of the other end of the power electrode 2110 is t2. The width t2 is smaller than the width t1. A distance "d" between the power electrode 2110 and the ground electrode 2120 may be constant. The distance "d" between the power electrode 2110 and the ground electrode 2120 may be 3 millimeters (mm) to 10 millimeters (mm). If the distance "d" is less than 3 mm, it may be difficult to perform discharge. If the distance "d" exceeds 10 mm, process uniformity may be reduced due to discharge. The other end of the power electrode 2110 may be rounded. Height h1 of an exposed power electrode 2110 may be greater than or equal to height h2 of the ground electrode 2120.

The power electrodes 2110 may include one or more holes 2112 at a surface facing the ground electrode 2120. The holes 2112 are regularly arranged. The holes 2112 may cause cathode discharge. The holes 2112 may be aligned in the first direction.

In capacitively coupled plasma, plasma density may increases with the increase in frequency of the RF power source 2170. However, the standing wave effect may increase with the increase in frequency of the RF power source 2170. The standing wave effect may restrict plasma uniformity and process uniformity. In addition, process stability and process reproducibility may be reduced with the increase in the frequency. Thus, an optimal frequency of the RF power source 2170 may be 30 MHz to 60 MHz.

Supplying RF power to nodes N1 and N2 of the power electrode 2110 may reduce the standing wave effect. A plasma density distribution may vary depending on a position where the RF power is supplied to the power electrode 2110.

The power electrodes 2110 may be equally divided into N parts. The RF power is supplied to the center of the N parts of the power electrode 2110. That is, the nodes N1 and N2 of the power electrode 2110 may be disposed in the center of the divided parts. A current distribution and/or a voltage distribution of the power electrode 2110 may be symmetrical to the center of the power electrode 2110.

For example, the power electrodes 2110 may include the nodes N1 and N2. The nodes N1 and N2 may supply the RF power source 2170 to the power electrode 2110. The nodes N1 and N2 include a first node N1 and a second node N2. A length of the power electrode 2110 is L. The first node N1 may be disposed at a position of L/4, and the second node N2 may be disposed at a position of 3L/4. Current may have a maximum value at the nodes N1 and N2, and a voltage may have a minimum value at the nodes N1 and N2. A distribution of the current or the voltage may be horizontally symmetrical to the center of the nodes N1 and N2. Phases of voltages at the nodes N1 and N2 may be in-phase.

Positions of the nodes N and N2 may be changed to have process uniformity of the first direction.

Plasma may be generated between the power electrode 2110 and the ground electrode 2120. A distance "d" between the power electrode 2110 and the ground electrode 2120 may be 3 mm to 15 mm. A structure where the power electrode 2110 and the ground electrode 2120 are adjacent to each other may enhance stability of plasma. In addition, the structure may reduce a potential of the plasma and/or a DC bias. The substrate may be floated to allow the plasma generating apparatus to provide a low lattice defect during a deposition process.

A tapered power electrode 2110 and a tapered ground electrode 2120 may improve a flow pattern of process gas. With t1 of one end of the power electrode 2110 is greater than width t2 of the other end of the power electrode 2110. Thus, the power supply line 2142 may be easily coupled with the power electrode 2110. Moreover, a process speed may be improved by increasing a discharge area.

A curvature-type power electrode 2110 and a curvature-type ground electrode 2120 may improve a flow pattern of process gas. The curvature-type power electrode 2110 and the curvature-type ground electrode 2120 may suppress arc discharge.

The height h1 of the power electrode 2110 may be greater than the height h2 of the ground electrode 2120. Thus, process uniformity and process speed may be ensured at a pressure of 5 Torr or less.

Preferably, width t2 of the other end of the power electrode 2110 may be about 10 mm. Preferably, width of the other end of the ground electrode 2120 may be about 10 mm. Preferably, a distance "d" between the power electrode 2110 and the ground electrode 2120 may be 3 mm to 15 mm. The substrate 2182 may be minimally exposed to plasma. That is, the plasma generating apparatus may generate remote plasma and a radical may be supplied to the substrate 2182.

The nozzles 2132 may be formed within the spacer 2232 to stably supply a process gas. In addition, misalignment of the nozzles 2132 caused by thermal expansion may be suppressed. Moreover, the nozzles 2132 formed within the spacer 2232 may overcome an electrical contact problem of the gas distribution unit 2130 and the ground electrode 2120.

The power distribution unit 2240 may be means for receiving power of the RF power source 2170 from a power terminal P1 and transferring the power to the power electrodes 2110. The power distribution unit 2250 may distribute RF power to the power supply unit 2240 or the power electrodes 2110.

The power distribution unit 2250 includes a base plate 2251 having a power distribution pattern 2257 penetrating the base plate 2251, a lower insulating pattern 2254 inserted into the power distribution pattern 2257 of the base plate 2251, an upper insulating pattern 2255 disposed on the lower insulating pattern 2254, a power distribution line 2256 disposed on the upper insulating pattern 2255, and a power distribution top plate 2259 covering a top surface of the base plate 2251. The power supply unit 2250 distributes the RF power to the power distribution lines 2142.

The base plate 2251 may have a penetration-type or trench-type power distribution pattern 2257. The shape of the power distribution pattern 2257 may be variously changed. The base plate 2251 may be made of a metal and may be grounded.

The lower insulating pattern 2254 is mounted on a bottom surface of the base plate 2251. The lower insulating pattern 2254 may have a through-hole into which the power supply line 2142 is inserted. The lower insulating pattern 2252 insulates the power supply line 2142 from the base plate 2251.

The upper insulating pattern 2255 is disposed on the lower insulating pattern 2254. Power distribution lines 2256 may be inserted into the upper insulating pattern 2255 to be fixed. Thus, the power distribution lines 2256 may be insulated from the base plate 2251 to be fixed.

Fixing means may electrically and mechanically the power distribution line 2256 and the power supply line 2142. The fixing means may be a bolt. The power distribution pattern 2257 may be a trench in which the power distribution line 2256 may be disposed. Length of the power distribution line 2256 may be the same at the power terminal P1.

The power distribution top plate 2259 is disposed on a top surface of the base plate 2251. The power distribution top plate 2259 may be grounded. Thus, the base plate 2251 and the power distribution top plate 2259 surrounding the power distribution line 2256 may form a transmission line. The power distribution unit 2240 may be disposed outside the vacuum container 2102.

The power supply line 2142 electrically connects the power distribution line 2256 and the power electrode 2110 to each other. The power supply line 2142 may support the power electrode 2110. A plurality of power supply lines 2142 may be connected to a single power electrode 2100. Thus, the power electrode 2110 may receive power in-phase at a plurality of positions.

It is difficult for the power distribution unit 2250 to use a transformer. This is because hysteresis loss of copy and transformer is large when a frequency of 30 MHz or higher is used. Thus, the most efficient method is to distribute a power with a circuit without using a transformer.

The RF power source 2170 supplies power to the power distribution line 2256 through an impedance matching network 2150. From a power supply point of the RF power source 2170, a distance between the power supply lines 2142 is constant. Thus, the power supply line 2142 may supply power in-phase to all the power electrodes 2110. The frequency of the RF power source 2170 may be 1 MHz or higher. Preferably, the frequency of the RF power source 2170 may be 30 MHz to 60 MHz. The impedance matching network 2160 may be means for maximally transmitting power of the RF power source 2170 to a load.

When a power electrode is perpendicularly disposed, a deposition rate in a substrate disposed below the power electrode may vary depending on position. An inclined structure of an electrode improves deposition non-uniformity. That is, discharge occurs between a power electrode and a ground electrode and a radical generated in each area is uniformly transferred to the substrate due to the inclination of a discharge area. Thus, deposition uniformity is improved.

Figure 16:
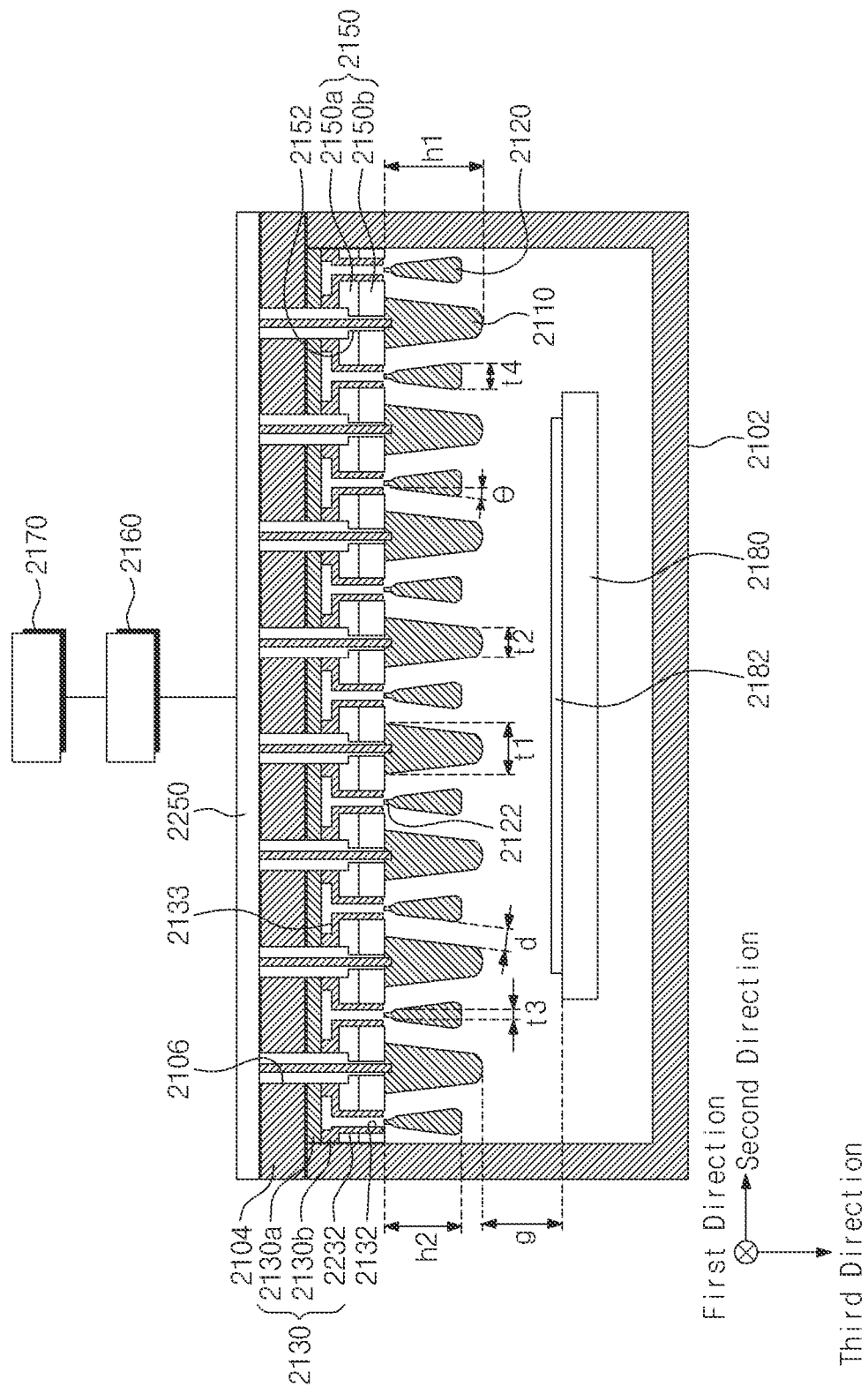
FIGS. 16 and 17 are cross-sectional views of a plasma generating apparatus according to other embodiments of the present invention.

FIG. 16 is a cross-sectional view of a plasma generating apparatus according to another embodiment of the present invention. In FIG. 16, sections different from FIGS. 12 to 15 will be extensively explained to avoid duplicate explanation.

Referring to FIG. 16, the plasma generating apparatus includes a vacuum container 2102 including a top plate 2104, insulating supporters 2150 extending parallel to each other below the top plate 2104 in a first direction and spaced apart from each other in a second direction intersecting the first direction, a gas distribution unit 2130 filling a space between the insulating supporters 2150 and disposed on the insulating supporters 2130, power electrodes 2110 disposed below the insulating supporters 2150 and extending in the first direction, and ground electrodes 2120 disposed below the space between the insulating supporters 2150 and extending in the first direction.

The gas distribution unit 2130 may include spacers 2232 arranged at regular intervals and extending in the first direction. The spacers 2232 may extend in a vertical direction (substrate direction) below a lower gas distribution plate 2130b. The spacer 2232 is disposed between the insulating supporters 2150. The nozzles 2132 are disposed through the spacer 2232. Thickness of the insulating supporters 2150 may be equal to height of the spacer 2232. One end of the nozzles 2132 may be connected to a first trench 2133, and the other end thereof may gradually increase in diameter. The nozzles 2132 disposed on the spacer 2230 may overcome a problem caused by thermal expansion or misalignment.

The ground electrode 2120 includes a protrusion 2122 formed on its top surface. A side or a lower side of the protrusion 2122 may be connected to a body of the ground electrode 2120 with a constant gradient. A process gas is injected through the nozzles 2132. The lower side of the protrusion 2122 may be tapered to prevent a nozzle-clogging phenomenon.

According to a modified embodiment of the present invention, a portion of the power electrode 2110 and a portion of the ground electrode 2120 may be inserted into the insulating supporter 2130. In this case, an auxiliary nozzle connected to the nozzles 2132 may be disposed at the ground electrode 2120.

Figure 17:
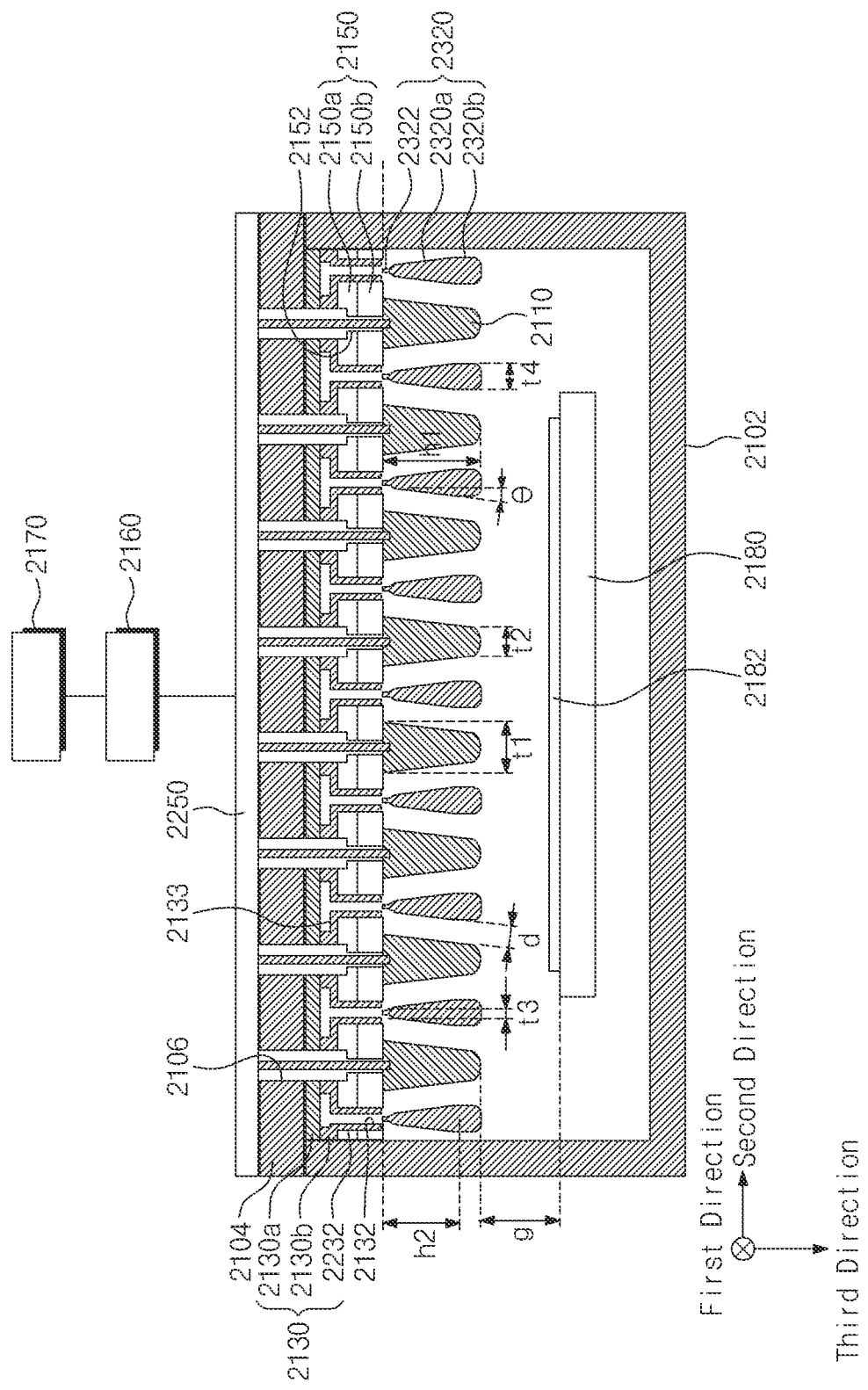

FIG. 17 is a cross-sectional view of a plasma generating apparatus according to still another embodiment of the present invention. In FIG. 17, sections different from FIGS. 12 to 16 will be extensively explained to avoid duplicate explanation.

Referring to FIG. 17, the plasma generating apparatus includes a vacuum container 2102 including a top plate 2104, insulating supporters 2150 extending parallel to each other below the top plate 2104 in a first direction and spaced apart from each other in a second direction intersecting the first direction, a gas distribution unit 2130 filling a space between the insulating supporters 2150 and disposed on the insulating supporters 2130, power electrodes 2110 disposed below the insulating supporters 2150 and extending in the first direction, and ground electrodes 2320 disposed below the space between the insulating spacers 250 and extending in the first direction.

The gas distribution unit 2130 may include spacers 2232 arranged at regular intervals and extending in the first direction. The spacers 2232 may extend below a lower gas distribution plate 2130b in a perpendicular direction (substrate direction). The spacer 2232 is disposed between the insulating supporters 2130. The nozzles 2132 are disposed through the spacer 2232. Thickness of the insulating supporters 2150 may be equal to height of the spacer 2232. One end of the nozzle 2132 may be connected to the first trench 2133, and the other end thereof may gradually increase in diameter. The nozzles 2132 exposed to the spacer 2230 may overcome a problem caused by thermal expansion or misalignment.

The ground electrode 2320 includes a taper portion 2320a increasing in width in a direction of the substrate 2182 and an extending portion 2320b having constant width.

Figure 18:
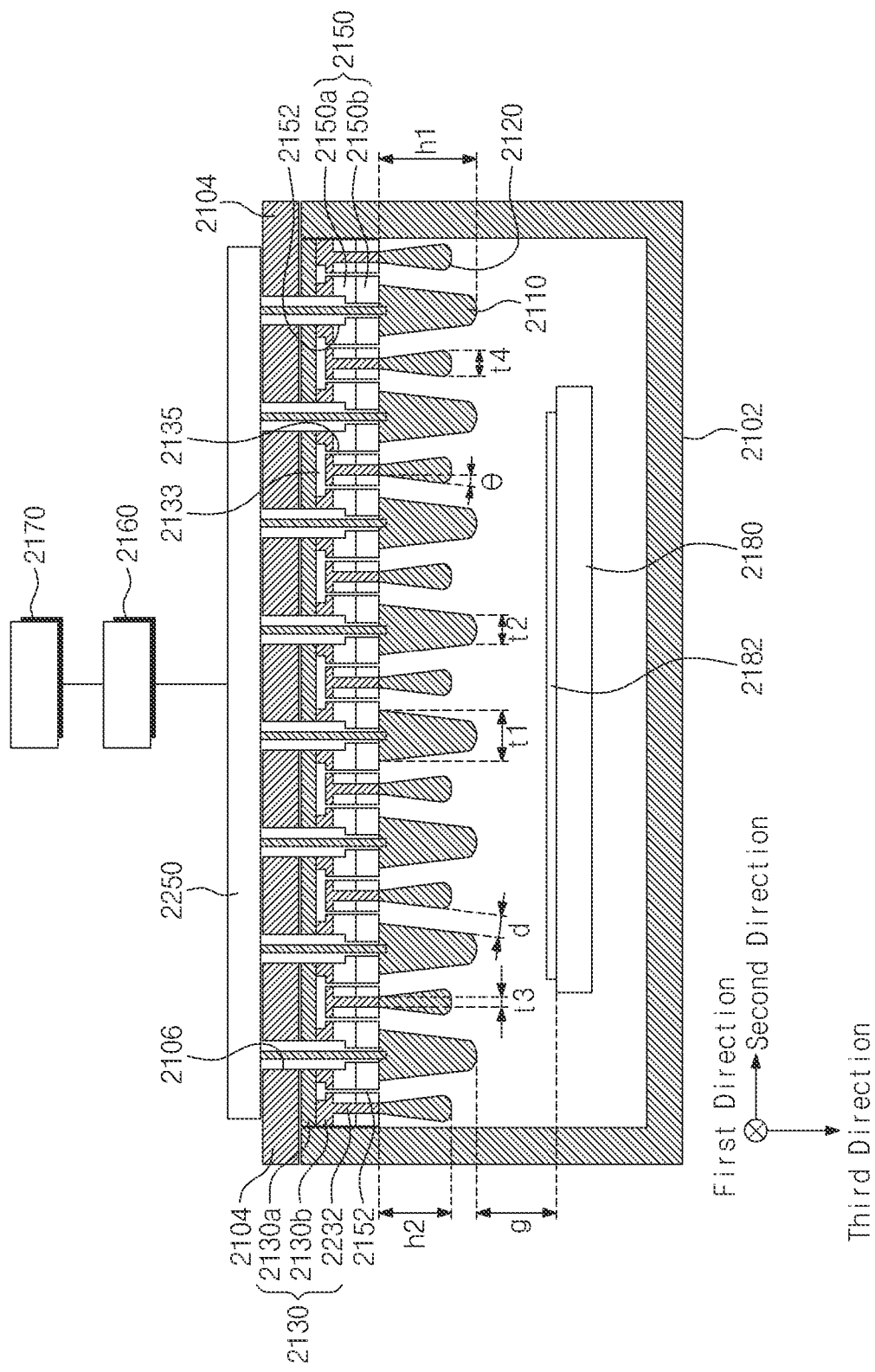
FIG. 18 illustrates a substrate processing apparatus according to another embodiment of the present invention.

FIG. 18 illustrates a substrate processing apparatus according to another embodiment of the present invention. In FIG. 18, sections different from FIGS. 12 to 16 will be extensively explained to avoid duplicate explanation.

Referring to FIG. 18, the substrate processing apparatus includes a vacuum container 2102 including a top plate 2104, insulating spacers 2150 extending below the top plate 2104 in a first direction and spaced apart from each other in a second direction intersecting the first direction, a gas distribution unit 2130 filling a space between the insulating supporters 2150 and disposed on the insulating supporters 2150, power electrodes 2110 disposed below the insulating supporters 2150 and extending in the first direction, and ground electrodes 2120 disposed below the space between the insulating supporters 2150 and extending in the first direction.

The gas distribution unit 2130 may include spacers arranged in regular intervals and extending in the first direction. The spacers 2232 may extend below a lower gas distribution plate 2130b in a perpendicular direction (substrate direction). The spacer 2232 is disposed between the insulating supporters 2130.

The nozzles 2152 are disposed through the insulating supporter 2130. Thickness of the insulating supporters 2150 may be equal to height of the spacer 2232. One end of the nozzles 2152 may be connected to preliminary nozzles 2135 disposed within a first trench 2133, and the other end thereof may be exposed to a bottom surface of the insulating supporter 2130.

A plasma generating apparatus according to an embodiment of the present invention may have a structure of divided power electrode. The divided power electrode may have a line shape and supply RF power to a plurality of positions to reduce standing wave effect and generate uniform plasma. In addition, a ground electrode may be disposed between the power electrodes to generate stable and independent plasma, remove the standing wave effect, and allow a substrate to remain floating. Thus, lattice defect density of the substrate caused by impact of the plasma may be reduced. A distance between the power electrode and the substrate may be several centimeters or less at a high pressure of several Torr.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A plasma generating apparatus comprising:
a plurality of ground electrodes inside a vacuum container and extending parallel to each other;
power electrodes between the ground electrodes, and
a dielectric supporter on which the ground electrodes and the power electrodes are mounted, wherein:
the ground electrodes and the power electrodes are in an area where a distance between each of the ground electrodes and an adjacent power electrode is constant,
the power electrodes are tapered in a direction facing a substrate,
each of the power electrodes has a shape of a first truncated triangular prism,
each of the ground electrodes comprises a shape of a second truncated triangular prism that is upside down to the first truncated triangular prism,
the power electrodes are connected to an RF power source,
a height of each of the power electrodes is greater than a height of each of the ground electrodes in the direction facing the substrate,
a pair of the ground electrodes are outside an outermost pair of the power electrodes,
each of the ground electrodes and each of the power electrodes has a rounded end facing the substrate,
the dielectric supporter includes a plurality of nozzles to inject a process gas between the ground electrode and the power electrode,
the vacuum container includes a top plate,
the plasma generating apparatus further comprises a gas distribution unit on the dielectric supporter and below the top plate of the vacuum container, the gas distribution unit distributing a process gas to the plurality of nozzles,
the gas distribution unit includes an upper gas distribution plate and a lower gas distribution plate below the upper gas distribution plate,
the lower gas distribution plate includes a first trench and preliminary nozzles;
the first trench extends in a first direction on a top surface of the lower gas distribution plate and aligns with the plurality of nozzles in the first direction, and
the preliminary nozzles are in the first trench and aligned with the plurality of nozzles.

2. The plasma generating apparatus of claim 1, wherein an angle between a direction extending along one surface of the power electrode and the direction facing the substrate is 5 degrees to 10 degrees.

3. The plasma generating apparatus of claim 1, wherein the power electrodes are present in an even number, and the ground electrodes are present in an odd number.

4. The plasma generating apparatus of claim 1, wherein the process gas includes at least one of $SiH_4$ gas, $H_2$ gas, Ar gas, and $NF_3$ gas.

5. The plasma generating apparatus of claim 1, further comprising:
a power distribution unit to distribute power to the power electrodes, connected to the power source,
wherein the power distribution unit supplies power to each of the power electrodes at two or more positions.

6. The plasma generating apparatus of claim 5, further comprising:
a power supply line connecting the power electrodes to the power distribution unit.

7. The plasma generating apparatus of claim 5, wherein a length from the power source to a power supply position of each of the power electrodes is identical.

8. The plasma generating apparatus of claim 5, further comprising a dielectric substance, wherein the power distribution unit is between the dielectric substance and the top plate of the vacuum container.

9. The plasma generating apparatus of claim 5, wherein the power distribution unit is outside the vacuum container.

10. The plasma generating apparatus of claim 5, wherein the power distribution unit includes:
power distribution lines to supply power to a plurality of points of the power electrode; and
a grounded guide unit around the power distribution lines.

11. The plasma generating apparatus of claim 1, wherein each of the power electrodes includes at least one hole on a surface facing the ground electrode.

12. The plasma generating apparatus of claim 1, wherein a distance between each of the ground electrodes and adjacent one(s) of the power electrodes is 3 millimeters to 10 millimeters.

13. The plasma generating apparatus of claim 1, wherein a frequency of the RF power source is 13.56 MHz to 100 MHz.

14. The plasma generating apparatus of claim 1, wherein each of the ground electrodes includes (i) a tapered portion increasing in width in the direction facing the substrate and (ii) an extending portion having constant width.

15. The plasma generating apparatus of claim 1, wherein the RF power is supplied to each of the power electrodes at a plurality of points.

16. A plasma generating apparatus comprising:
a vacuum container;
ground electrodes inside the vacuum container and extending parallel to each other in a first direction;
power electrodes between the ground electrodes in a second direction intersecting the first direction; and
a dielectric supporter on which the ground electrodes and the power electrodes are mounted,
wherein:
the power electrodes have (i) a shape of a first truncated triangular prism, (ii) a first height from a first surface contacting the dielectric supporter in a third direction orthogonal to the first direction and the second direction, (iii) a first thickness on the first surface contacting the dielectric supporter, and (iv) a second thickness at an opposite end in the third direction from the first surface,
the ground electrodes have (i) a shape of a second truncated triangular prism that is upside down to the first truncated triangular prism, (ii) a second height from the first surface contacting the dielectric supporter, (iii) a third thickness on the first surface contacting the dielectric supporter, and (iv) a fourth thickness at an opposite end in the third direction from the first surface,
the first thickness is greater than the second thickness, and the third thickness is smaller than the fourth thickness,
a pair of the ground electrodes are outside an outermost pair of the power electrodes,
each of the ground electrodes and each of the power electrodes has a rounded end facing the substrate,
the dielectric supporter includes a plurality of nozzles to inject a process gas between the ground electrode and the power electrode,
the vacuum container includes a top plate, the plasma generating apparatus further comprises a gas distribution unit on the dielectric supporter and below the top plate of the vacuum container, the gas distribution unit distributing a process gas to the plurality of nozzles, the gas distribution unit includes an upper gas distribution plate and a lower gas distribution plate below the upper gas distribution plate, the lower gas distribution plate includes a first trench and preliminary nozzles;

the first trench extends in a first direction on a top surface of the lower gas distribution plate and aligns with the plurality of nozzles in the first direction, and the preliminary nozzles are in the first trench and aligned with the plurality of nozzles.

17. The plasma generating apparatus of claim 16, wherein the first height is greater than the second height.

18. The plasma generating apparatus of claim 16, wherein a vertical distance between each of the ground electrodes and an adjacent one of the power electrodes is constant.

19. A plasma generating apparatus comprising:
a vacuum container;
ground electrodes inside the vacuum container;
power electrodes inside the vacuum container and spaced apart from the ground electrodes; and
a substrate holder facing the power electrodes and the ground electrodes,
wherein:
the substrate holder electrically floats,
the power electrodes are on a same plane as the ground electrodes and include a discharge area where a distance between each of the ground electrodes and adjacent ones of the power electrodes is constant,
the discharge area obliquely contacts on a plane on which the power electrode is disposed,
the power electrodes are connected to an RF power source,
each of the power electrodes has a shape of a first truncated triangular prism,
each of the ground electrodes comprises a shape of a second truncated triangular prism upside down to the first truncated triangular prism,
a pair of the ground electrodes are outside an outermost pair of the power electrodes,
each of the ground electrodes and each of the power electrodes has a rounded end facing the substrate,
the dielectric supporter includes a plurality of nozzles to inject a process gas between the ground electrode and the power electrode,
the vacuum container includes a top plate,
the plasma generating apparatus further comprises a gas distribution unit on the dielectric supporter and below the top plate of the vacuum container, the gas distribution unit distributing a process gas to the plurality of nozzles,
the gas distribution unit includes an upper gas distribution plate and a lower gas distribution plate below the upper gas distribution plate,
the lower gas distribution plate includes a first trench and preliminary nozzles;
the first trench extends in a first direction on a top surface of the lower gas distribution plate and aligns with the plurality of nozzles in the first direction, and
the preliminary nozzles are in the first trench and aligned with the plurality of nozzles.

20. The plasma generating apparatus of claim 1, wherein the height of each of the power electrodes and the height of each of the ground electrodes are a distance from a surface contacting the dielectric supporter to an end of each electrode along a direction towards the substrate.

21. The plasma generating apparatus of claim 20, wherein each of the power electrodes has a decreasing thickness along the direction from the surface contacting the dielectric supporter towards the substrate, and each of the ground electrodes has an increasing thickness along the direction from the surface contacting the dielectric supporter towards the substrate.

* * * * *